US009203217B2

(12) United States Patent
Takano

(10) Patent No.: US 9,203,217 B2
(45) Date of Patent: Dec. 1, 2015

(54) INVERTER APPARATUS

(71) Applicant: Makoto Takano, Suzuka (JP)

(72) Inventor: Makoto Takano, Suzuka (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 172 days.

(21) Appl. No.: 14/123,803

(22) PCT Filed: Oct. 26, 2012

(86) PCT No.: PCT/JP2012/077750
§ 371 (c)(1),
(2) Date: Dec. 16, 2013

(87) PCT Pub. No.: WO2013/065603
PCT Pub. Date: May 10, 2013

(65) Prior Publication Data
US 2014/0104759 A1    Apr. 17, 2014

(30) Foreign Application Priority Data
Oct. 31, 2011   (JP) .................. 2011-239686

(51) Int. Cl.
*H02B 1/04*    (2006.01)
*H05K 7/06*    (2006.01)
*B62B 3/00*    (2006.01)
(Continued)

(52) U.S. Cl.
CPC *H02B 1/04* (2013.01); *B62B 3/002* (2013.01); *H02B 1/015* (2013.01); *H02M 7/48* (2013.01); *H05K 7/06* (2013.01); *H05K 7/1432* (2013.01); *H05K 7/20909* (2013.01); *H02B 3/00* (2013.01); *H02M 7/003* (2013.01)

(58) Field of Classification Search
CPC ............ H02B 1/04; H02B 1/015; H02B 1/30; H02B 1/012; H02M 7/003; H02M 7/06; H02M 7/48; H05K 5/02; H05K 5/0204; B62B 3/002
USPC ......... 361/601, 605–611, 622, 624, 636–648, 361/652–657; 312/223.1, 223.2, 223.3, 312/223.6, 236, 265.5, 100, 111, 108, 273; 200/50.21, 50.25, 50.27; 363/15, 26, 363/39, 141–143; 174/50, 50.02, 520, 542
See application file for complete search history.

(56) References Cited

U.S. PATENT DOCUMENTS 3,229,058 A * 1/1966 Schymik .................... 200/50.27
4,482,936 A * 11/1984 Saito ............................ 361/606
(Continued)

FOREIGN PATENT DOCUMENTS

JP    H05-78196 U    10/1993
JP    H07-123539 A    4/1995
(Continued)

*Primary Examiner* — Michail V Datskovskiy
(74) *Attorney, Agent, or Firm* — Manabu Kanesaka

(57) ABSTRACT

An inverter apparatus includes an inverter stack having casters at bottom and a switchboard for entering the inverter stack from a front side to store. The switchboard has an output relay terminal, at a storage bottom portion to store the inverter stack, extending along an entering direction of the inverter stack. The output relay terminal is attached with an output electric wire connected to a load at a rear end portion, is connected to an output terminal of the inverter stack at a front end portion, and is fastened to an output relay bar protruding downward from the bottom of the inverter stack through a fastening member.

3 Claims, 28 Drawing Sheets

(51) Int. Cl.
    *H02M 7/48*           (2007.01)
    *H02B 1/015*         (2006.01)
    *H05K 7/14*           (2006.01)
    *H05K 7/20*           (2006.01)
    *H05K 5/02*           (2006.01)
    *H02B 3/00*           (2006.01)
    *H02M 7/00*           (2006.01)

(56) References Cited

U.S. PATENT DOCUMENTS

| | | |
|---|---|---|
| 4,772,999 A | 9/1988 | Fiorina |
| 5,481,075 A * | 1/1996 | Kleinecke et al. ......... 200/50.21 |
| 7,724,503 B2 * | 5/2010 | Talja .............................. 361/609 |
| 8,289,709 B2 * | 10/2012 | Feltner et al. ................. 361/695 |
| 8,325,479 B2 * | 12/2012 | Siracki et al. ............. 361/679.5 |
| 2008/0084148 A1 * | 4/2008 | Talja ........................... 312/223.6 |
| 2009/0015190 A1 | 1/2009 | Siemes |
| 2012/0014063 A1 * | 1/2012 | Weiss ............................ 361/697 |

FOREIGN PATENT DOCUMENTS

| | | |
|---|---|---|
| JP | H08-047268 A | 2/1996 |
| JP | 2006-020500 A | 1/2006 |
| JP | 2010-004707 A | 1/2010 |
| JP | 2010-035295 A | 2/2010 |
| JP | 2010-114971 A | 5/2010 |

* cited by examiner

INVERTER APPARATUS

RELATED APPLICATIONS

The present application is National Phase of International Application No. PCT/JP2012/077750 filed Oct. 26, 2012, and claims priority from Japanese Applications No. 2011-239686 filed Oct. 31, 2011.

TECHNICAL FIELD

The present invention relates to an inverter apparatus. Particularly, it relates to an inverter apparatus which has an inverter stack with casters at its bottom, and a switchboard containing the inverter stack entering from its front side.

BACKGROUND ART

According to the background art, an apparatus having an inverter stack with casters at its bottom, and a switchboard containing the inverter stack entering from its front side has been known as an inverter apparatus (e.g. see Patent Literature 1).

CITATION LIST

Patent Literature

Patent Literature 1: JP-A-7-123539

SUMMARY OF THE INVENTION

Technical Problem

Although there is no precise description in the Patent Literature 1, the inverter apparatus according to the background art is formed so that an output terminal of the inverter stack and an output relay terminal which forms the switchboard and to which an output electric wire connected to a load is attached are connected to each other by a flat plate-like output relay bar. For detachment of the inverter stack from the switchboard due to maintenance work or the like, it is necessary to remove a fastening member fastening the output relay bar and the output terminal from each other and further remove a fastening member fastening the output relay bar and the output relay terminal. Consequently, the work of detaching the inverter stack is complicated.

In consideration of such actual circumstances, an object of the invention is to provide an inverter apparatus in which an inverter stack can be easily detached from a switchboard.

Solution to Problem

In order to achieve the foregoing object, the inverter apparatus according to the first embodiment of the invention relates to an inverter apparatus including an inverter stack having casters at bottom, and a switchboard for entering the inverter stack from a front side to store. The switchboard has an output relay terminal, at a storage bottom portion to store the inverter stack, extending along an entering direction of the inverter stack. The output relay terminal is fastened to an output relay bar protruding downward from the bottom of the inverter stack through a fastening member. The output relay bar has a rear end portion attached with an output electric wire connected to a load, and a front end portion connected to an output terminal of the inverter stack.

In addition, the inverter apparatus according to the second embodiment of the invention is the aforementioned inverter apparatus according to the first embodiment and further including an input relay bar having one end portion fastened to an input-side terminal of the switchboard through a fastening member, and another end portion fastened to an input terminal of the inverter stack through a fastening member to thereby connect the input-side terminal and the input terminal to each other. The input relay bar is arranged so that the fastening members are inserted in hole portions formed with notches communicating with a common side portion.

In addition, the inverter apparatus according to the third embodiment of the invention is the aforementioned inverter apparatus according to first or second embodiment, wherein the output relay bar has a first output relay bar and a second output relay bar. The first output relay bar extends in a vertical direction and has an upper end portion connected to the output terminal. The second output relay bar has a base part extending in the vertical direction, and a front end part extending along the entering direction of the inverter stack from a lower end of the base part. The base part is fastened to a lower end portion of the first output relay bar through a fastening member, and the front end part is fastened to the output relay terminal through a fastening member. The second output relay bar is formed so that a through-hole to insert the fastening member has a diameter larger than an outer diameter of the fastening member.

Advantageous Effects of the Invention

According to the invention, the state of output-side connection of the inverter stack to the switchboard can be released by a simple operation of unfastening the output relay terminal from the output relay bar because the output relay terminal as a constituent of the switchboard is provided in the storage bottom portion where the inverter stack is stored so that the output relay terminal extends along the entering direction of the inverter stack, and the output relay terminal has the rear end portion to which an output electric wire connected to a load is attached, and the front end portion which is connected to the output terminal of the inverter stack and which is fastened to the output relay bar protruding downwards from the bottom of the inverter stack, through the fastening member. Accordingly, the inverter stack can be detached from the switchboard easily.

DESCRIPTION OF THE EMBODIMENTS

A preferred embodiment of an inverter apparatus according to the invention will be described below in detail with reference to the accompanying drawings.

Figure 1:
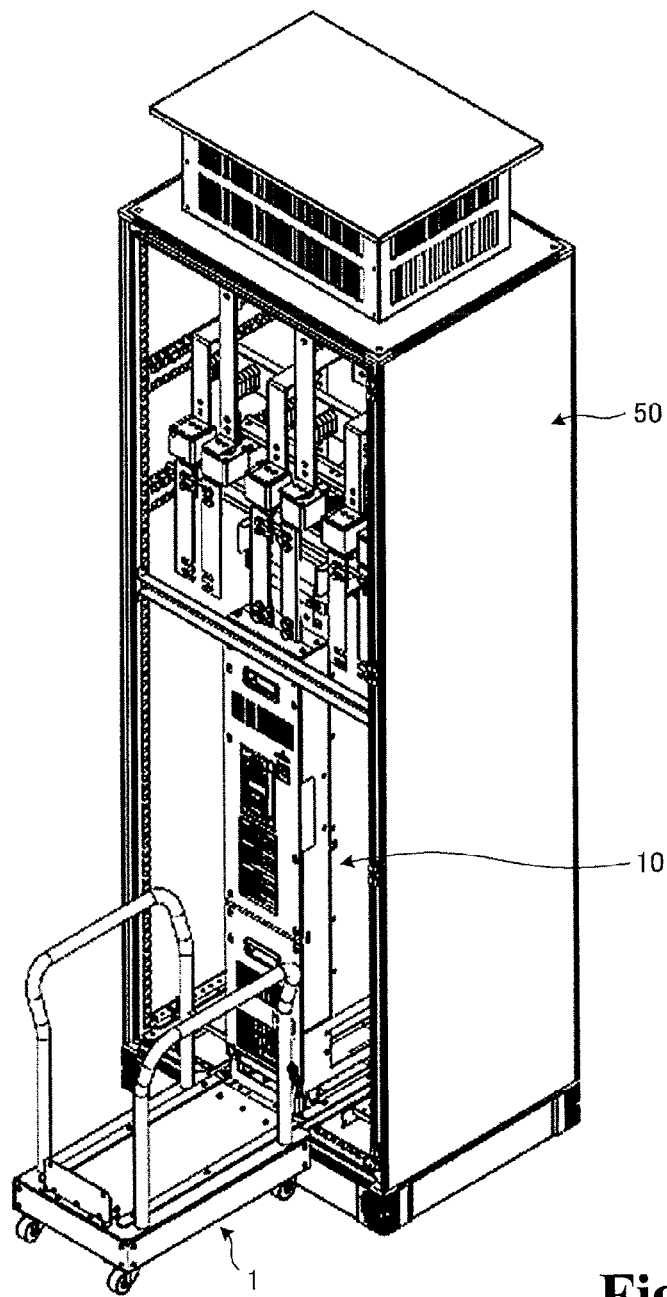
FIG. 1 is a perspective view showing an inverter apparatus according to an embodiment of the invention.
Figure 2:
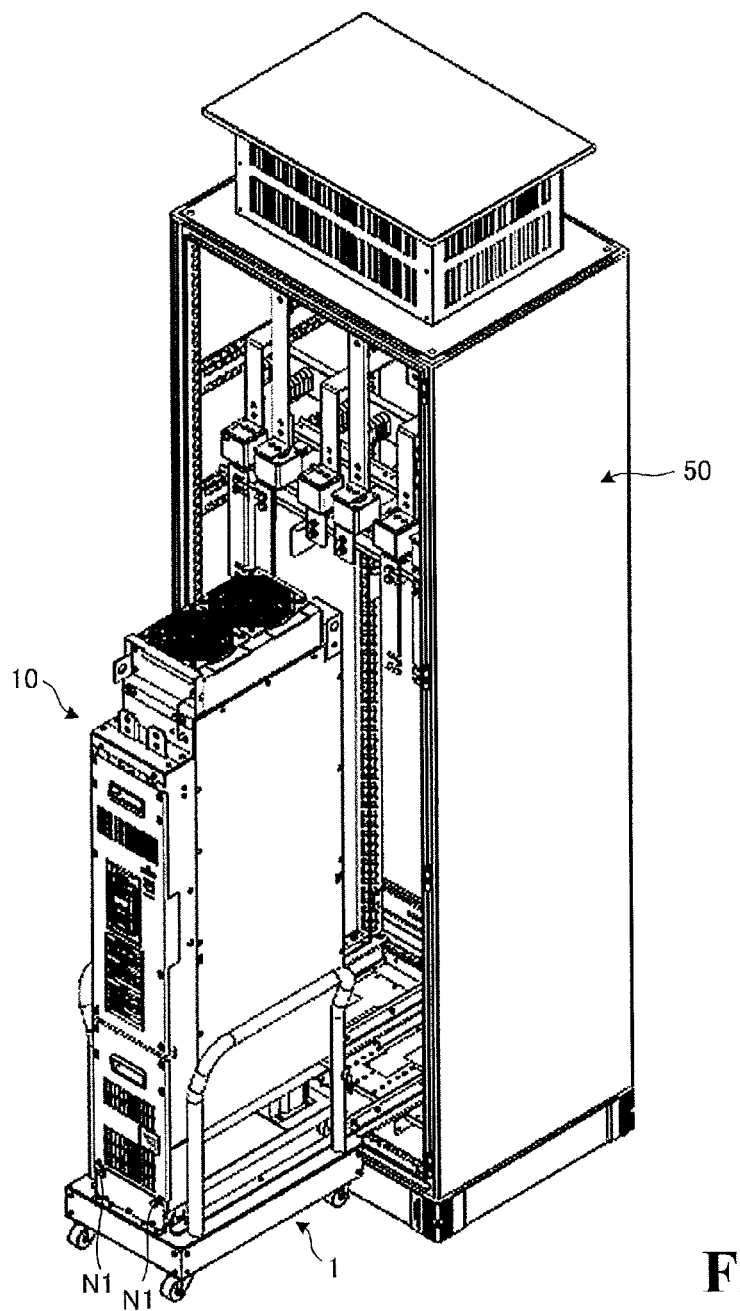
FIG. 2 is a perspective view showing the state where an inverter stack as a constituent of the inverter apparatus shown in FIG. 1 is conveyed on a transportation cart.

FIG. 1 is a perspective view showing an inverter apparatus according to an embodiment of the invention. The inverter apparatus exemplified here is configured to include an inverter stack 10, and a switchboard 50. The inverter stack 10 has an inverter circuit in its inside. As shown in FIG. 2, the inverter stack 10 is transported by means of a transportation cart 1 and disposed in the switchboard 50 as a target.

Figure 3:
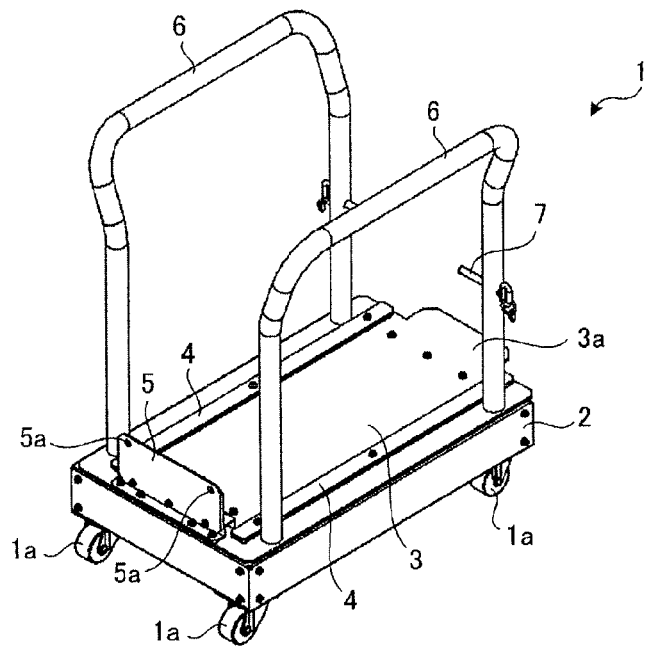
FIG. 3 is a perspective view showing the state where the transportation cart applied to the inverter apparatus shown in FIGS. 1 and 2 is viewed from the front side.
Figure 4:
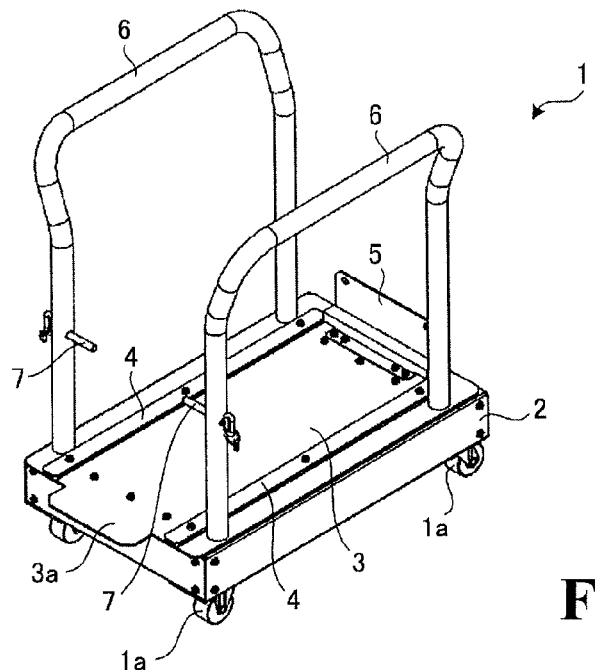
FIG. 4 is a perspective view showing the state where the transportation cart applied to the inverter apparatus shown in FIGS. 1 and 2 is viewed from the rear side.

FIGS. 3 and 4 show the transportation cart 1 applied to the inverter apparatus shown in FIGS. 1 and 2. FIG. 3 is a perspective view showing the state where the transportation cart 1 is viewed from the front side. FIG. 4 is a perspective view showing the state where the transportation cart 1 is viewed from the rear side.

As shown in FIGS. 3 and 4, the transportation cart 1 is configured so that a support surface 3, rail guides (guide members) 4, a fixing metal plate (fixing support member) 5 and grippers 6 are provided on a base 2 having a plurality of (e.g. four) cart casters 1a.

Figure 5:
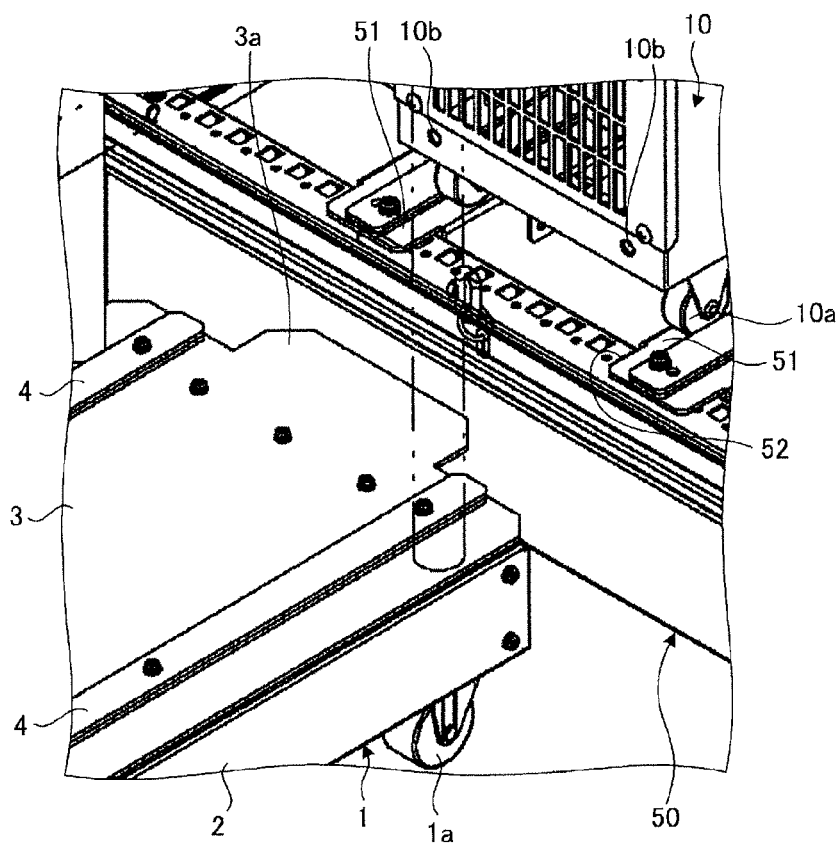
FIG. 5 is an enlarged perspective view showing a state where the transportation cart approaches a switchboard.

The support surface 3 is a surface which is made of a steel plate or the like on an upper surface of the base 2 and on which casters 10a provided at the bottom of the inverter stack 10 can be rolled. The support surface 3 supports the inverter stack 10 in a state where the inverter stack 10 is placed on the support surface 3. As shown in FIG. 5, the support surface 3 has the same height level as two placement surfaces 51 of the switchboard 50 on which the inverter stack 10 is placed, that is, surfaces on which the casters 10a of the inverter stack 10 can be rolled.

Such a support surface 3 is provided with a protrusion portion 3a. The protrusion portion 3a is a plate-like portion which is formed so as to protrude rearward from a rear edge portion of the support surface 3. The lateral width of the protrusion portion 3a is fitted to the distance between the two placement surfaces 51 in the switchboard 50. As shown in FIG. 5, the protrusion portion 3a enters an entrance portion 52 of the switchboard 50 formed between the placement surfaces 51 to thereby perform horizontal alignment when the transportation cart 1 is made to approach from the front side.

The rail guides 4 are long plate-like members which extend along in a front/rear direction at left and right ends of the support surface 3. These rail guides 4 are fixed to the support surface 3 by screws or the like. Such rail guides 9 guide rolling of the casters 10a of the inverter stack 10 and restrict displacement of the inverter stack 10 in a horizontal direction when the inverter stack 10 supported by the support surface 3 in a state where the inverter stack 10 is placed on the support surface 3 is moved toward the switchboard 50.

The fixing metal plate 5 is a plate-like member which is provided on the front side of the support surface 3 so as to be erected on the base 2. A plurality of (e.g. two) threaded holes 5a is formed in the fixing metal plate 5. These threaded holes 5a are respectively provided so as to correspond to threaded holes 10b formed in the front of the lower portion of the inverter stack 10 when the inverter stack 10 is supported by the support surface 3 in a state where the inverter stack 10 is placed on the support surface 3. Thus, when the inverter stack 10 is supported by the support surface 3, screws N1 are inserted both in the threaded holes 5a of the fixing metal plate 5 and in the threaded holes 10b of the inverter stack 10 from the front side, and the screws N1 are rotated around their axial centers so as to be tightened to thereby fasten the fixing metal plate 5 to the inverter stack 10.

That is, the fixing metal plate 5 is fastened to the inverter stack 10 supported by the support surface 3, through fastening members such as screws N1 to thereby fix and support the inverter stack 10.

The grippers 6 are formed as a pair of left and right grippers on the base 2. Each of these grippers 6 is configured in such a manner that a pipe as a long rod-like member is bent suitably and opposite ends of the pipe are connected to the base 2 by welding or the like. The grippers 6 are gripped by a user, that is, a person conveying the inverter stack 10. Incidentally, the sign 7 in FIGS. 3 and 4 designates a stopper provided in each gripper 6.

Such an inverter stack 10 placed on the support surface 3 of the transportation cart 1 so as to be supported by the support surface 3 is conveyed to the front side of the switchboard 50 as a target of installation as shown in FIG. 2 and then the transportation cart 1 is made to approach the switchboard 50 and the protrusion portion 3a enters the predetermined entrance portion 52 of the switchboard 50 to thereby perform alignment. The screws N1 inserted in the threaded holes 5a and 10b of the fixing metal plate 5 and the inverter stack 10 are removed to unfasten the inverter stack 10 from the fixing metal plate 5, and the inverter stack 10 is moved to enter the switchboard 50 from the front side, so that the inverter stack 10 can be stored in the switchboard 50 as shown in FIG. 1.

Figure 6:
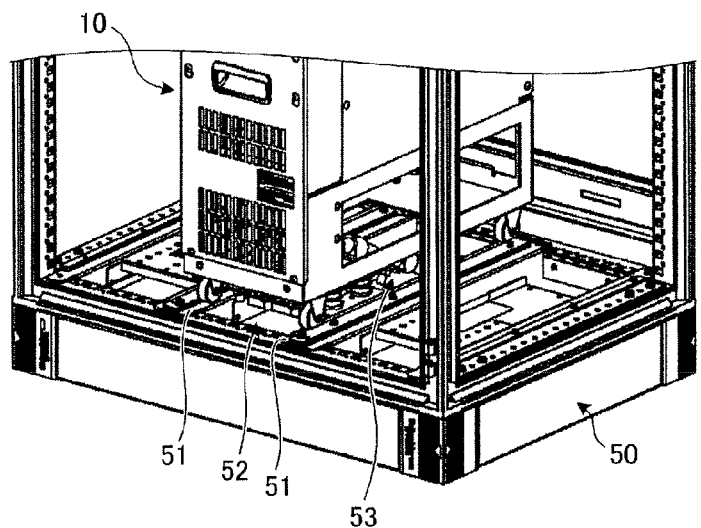
FIG. 6 is a perspective view showing a storage bottom portion of the switchboard shown in FIGS. 1 and 2, in which portion the inverter stack is stored.
Figure 7:
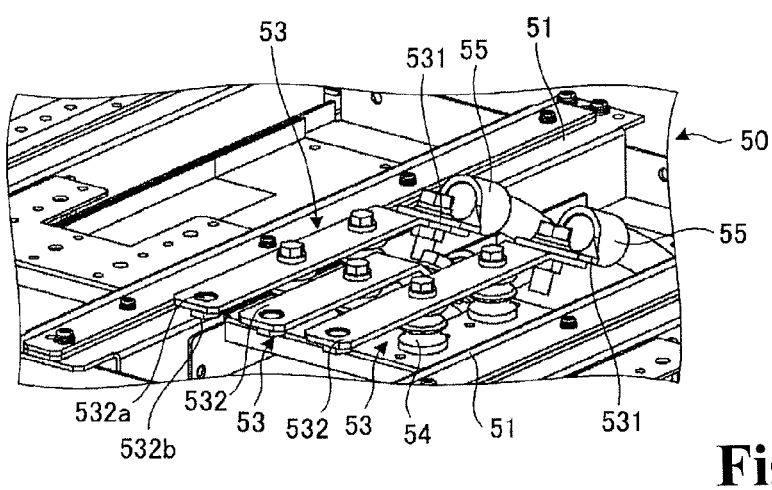
FIG. 7 is an enlarged perspective view showing an important part of the storage bottom portion shown in FIG. 6.
Figure 8:
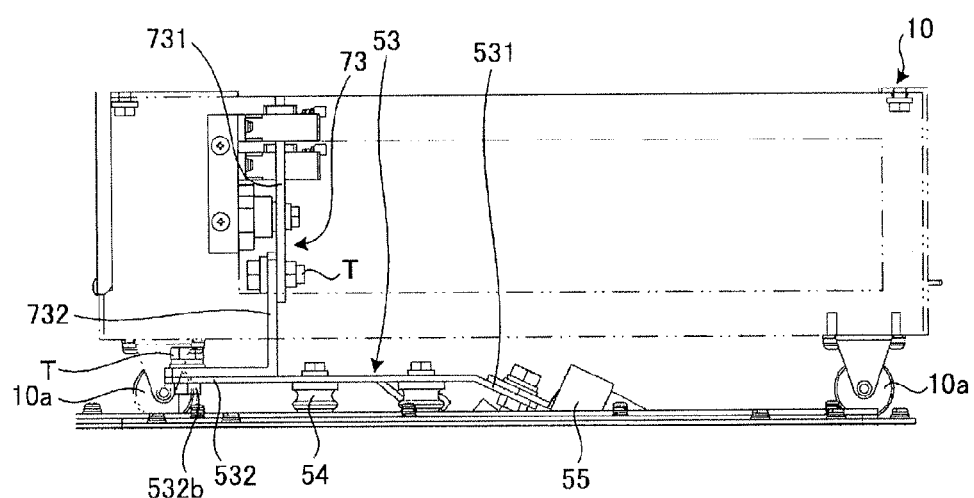
FIG. 8 is an explanatory view showing the state where the storage bottom portion of the switchboard shown in FIG. 6 is seen from a side.

FIG. 6 is a perspective view showing a storage bottom portion of the switchboard 50 shown in FIGS. 1 and 2, in which portion the inverter stack 10 is stored. FIG. 7 is an enlarged perspective view showing an important part of the storage bottom portion shown in FIG. 6. FIG. 8 is an explanatory view showing the state where the storage bottom portion of the switchboard 50 shown in FIG. 6 is seen from a side. As shown in FIGS. 6 to 8, the switchboard 50 has output relay terminals 53.

The output relay terminals 53 are provided as a plurality of (e.g. three) output relay terminals. That is, a U-phase output relay terminal 53, a V-phase output relay terminal 53 and a W-phase output relay terminal 53 extend along the direction of entrance of the inverter stack 10, that is, along the front/rear direction, and are provided in the storage bottom portion of the switchboard 50 so as to be disposed in parallel with one another through insulators 54. These output relay terminals 53 have rear end portions 531 bent downward respectively. Output electric wires 55 each connected to a load such as a motor are attached to the rear end portions 531 respectively. In addition, the output relay terminals 53 further have front end portions 532 respectively. Through-holes 532a are formed in the front end portions 532 respectively. Nuts 532b are fixed and supported to lower surfaces corresponding to the through-holes 532a respectively.

These output relay terminals 53 are located below the bottom of the stored inverter stack 10. More particularly, these output relay terminals 53 are located at a height level lower than the casters 10a of the inverter stack 10.

Figure 9:
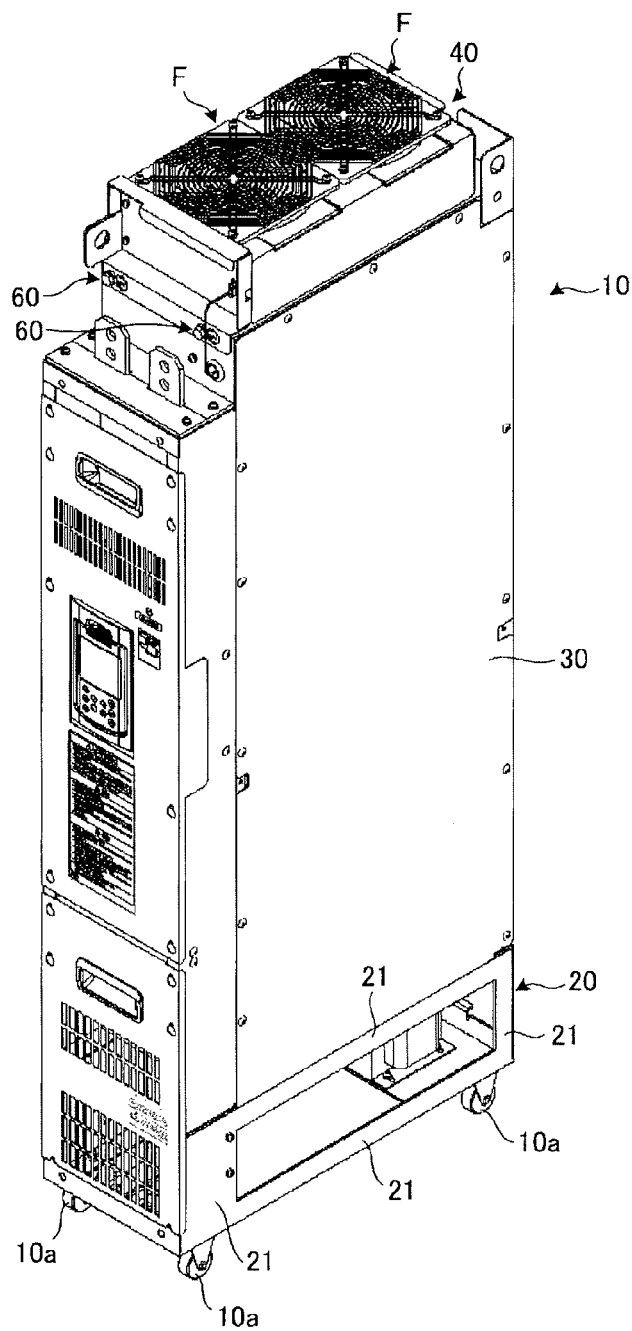
FIG. 9 is a perspective view showing the inverter stack as a constituent of the inverter apparatus shown in FIGS. 1 and 2.

FIG. 9 is a perspective view showing the inverter stack 10 which is a constituent of the inverter apparatus shown in FIGS. 1 and 2. The inverter stack 10 is configured to include a lower frame 20, an inverter body 30, and a fan block 40. The lower frame 20 forms the bottom of the inverter stack 10 and has the aforementioned casters 10a. Although details will be described later, the lower frame 20 is formed so that a plurality of frame members 21 is connected by screws or the like to form respective sides of a rectangular parallelepiped.

Figure 10:
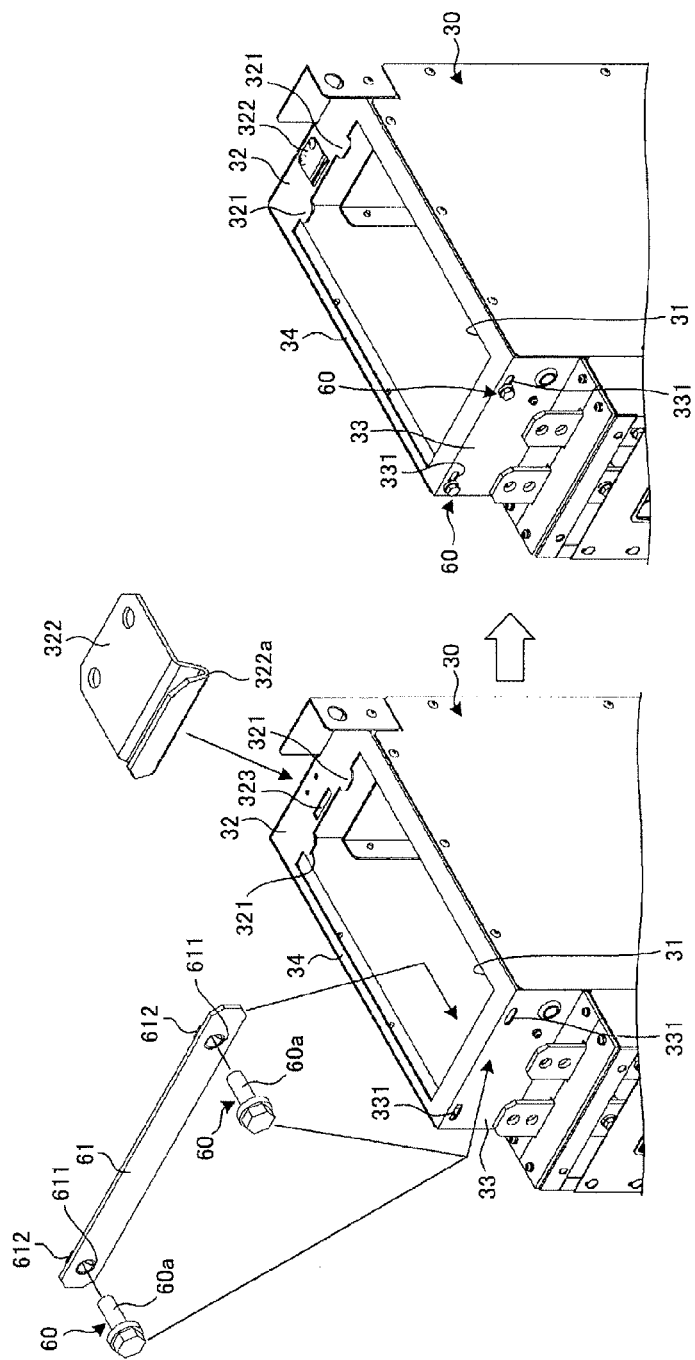
FIG. 10 is an explanatory view showing the configuration of an upper surface of an inverter body.

The inverter body 30 is a housing containing various circuits such as an inverter circuit, etc. in the inside. As shown in FIG. 10, an opening 31 is formed in an upper surface of the inverter body 30. Two protrusive pieces 321 protruding frontward are formed at a rear edge portion 32 of the upper surface of such an inverter body 30 where the opening 31 is formed. In addition, a leaf spring member 322 is fastened to the rear edge portion 32 by screws or the like so as to be fixed. The leaf spring member 322 has a frond end portion 322a shaped to be bent downward so that the front end portion 322a enters a rectangular through-hole 323 formed at the rear edge portion 32, from above.

Two long holes 331 which are long in the horizontal direction are formed in an upper front surface 33 connected to the upper surface of the inverter body 30 where the opening 31 is formed. Body portions 60a of bolt members 60 pass through the long holes 331 respectively from the front side. The body portions 60a which pass through the long holes 331 are thread-engaged with nuts 612 fixed to a metal plate member 61 which is a long plate-like member, while the body portions 60a pass through through-holes 611 which are formed in the metal plate member 61 and which are larger than the long holes 331. Though not shown in FIG. 10, dropping-off prevention nuts 62 are fixed to front end portions 60b of the bolt members 60 respectively (see FIGS. 18 and 19).

Figure 11:
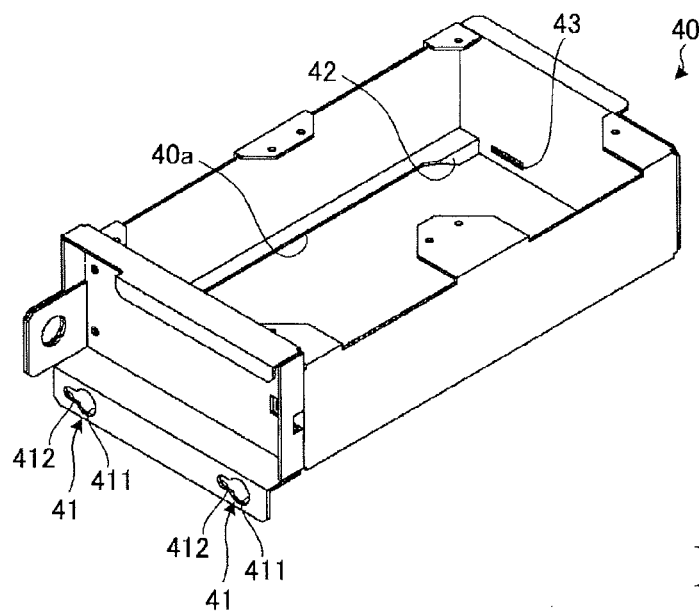
FIG. 11 is a perspective view showing the configuration of a fan block.

The fan block 40 is a box-like block which is disposed on the upper portion of the inverter body 30 and in which a plurality of fans F for sending air out to the inverter body 30 is stored. As shown in FIG. 11, the fan block 40 is shaped like a rectangular parallelepiped having opened upper and lower surfaces.

In such a fan block 40, engagement holes 41, flanges 42 and lock holes 43 are formed. The engagement holes 41 are formed as a plurality of (e.g. two) holes in a lower front surface of the fan block 40, that is, a front surface of a portion extending downward from an extension end portion extending frontward from a lower end portion of a front surface of the fan block 40. These engagement holes 41 are keyhole-shaped holes each of which is formed so that a detachment hole portion 411 having a diameter larger than that of a head portion 60c of the bolt member 60 and a tightening hole portion 412 having a diameter smaller than that of the head portion 60c of the bolt member 60 continue to each other.

The flanges 42 are formed so as to extend downward on the rear side of left and right lower edge portions of the fan block 40 where the lower opening 40a is formed. The lock holes 43 are formed in the rear surface of the fan block 40 and have a size allowing insertion of the protrusive pieces 321.

Figure 12:
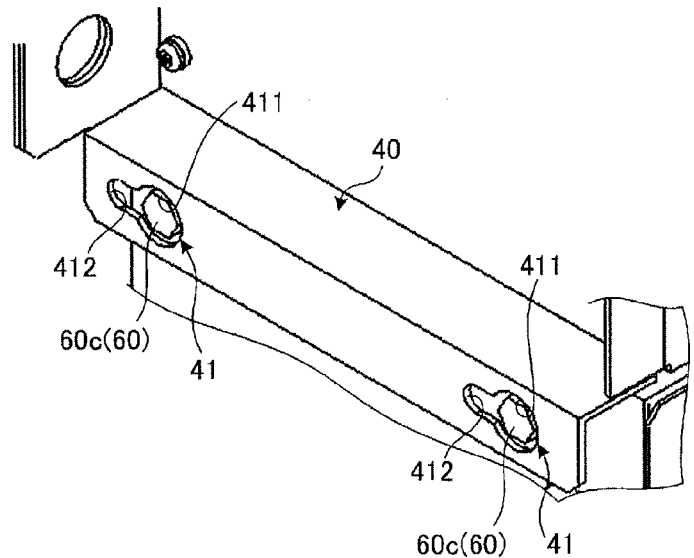
FIG. 12 is an explanatory view for explaining a procedure of arrangement of the fan block in the inverter body.
Figure 13:
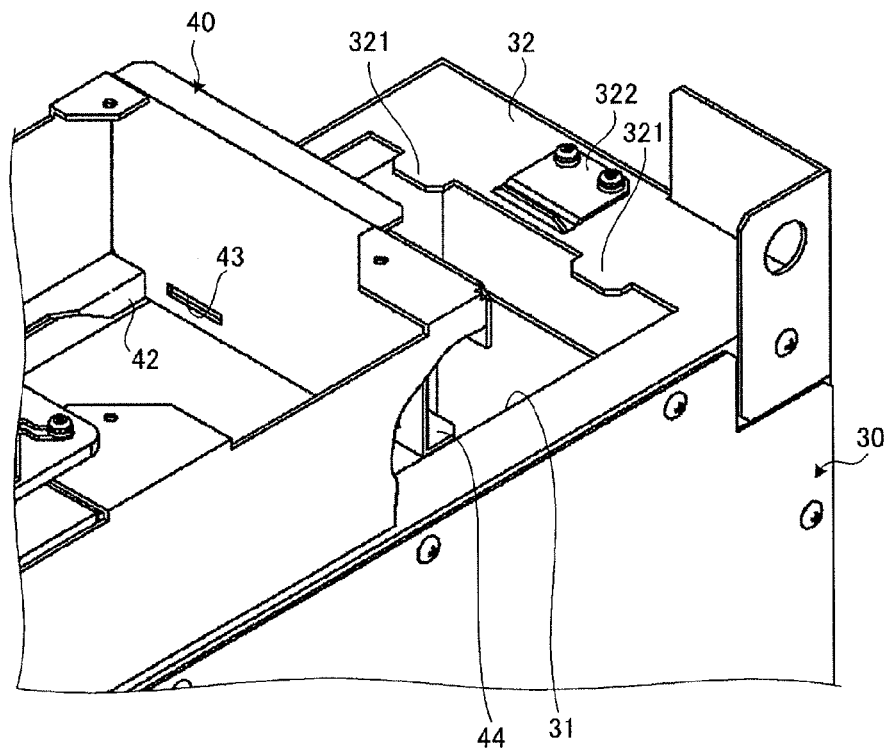
FIG. 13 is an explanatory view for explaining a procedure of arrangement of the fan block in the inverter body.
Figure 14:
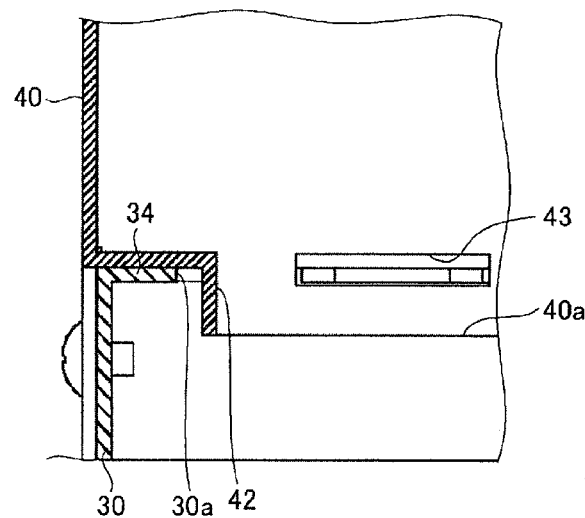
FIG. 14 is an enlarged sectional view for explaining a procedure of arrangement of the fan block in the inverter body and showing the state where an important part thereof is seen from the front side.

Such a fan block 40 is disposed while engaged with the inverter body 30 as follows. As shown in FIG. 12, the fan block 40 is moved to slide on the upper surface of the inverter body 30 from the front side toward the rear so that the head portions 60c of the bolt members 60 relatively pass through the detachment hole portions 411 of the engagement holes 41. On this occasion, as shown in FIGS. 13 and 14, the flanges 42 of the fan block 40 are located inside the upper edge portion 34 of the upper surface of the inverter body 30 where the opening 31 is formed, so that the flanges 42 restrict the fan block 40 from shifting in the horizontal direction more than necessary when the fan block 40 slides.

Figure 15:
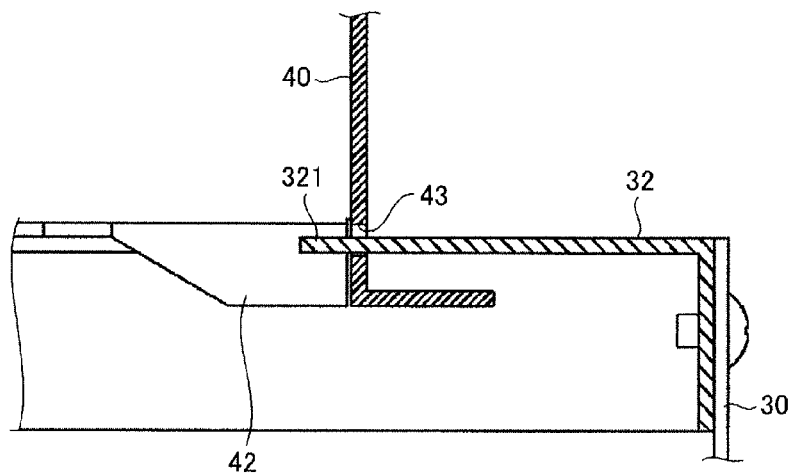
FIG. 15 is an enlarged sectional view for explaining a procedure of arrangement of the fan block in the inverter body and showing the state where the important part thereof is seen from a side.
Figure 16:
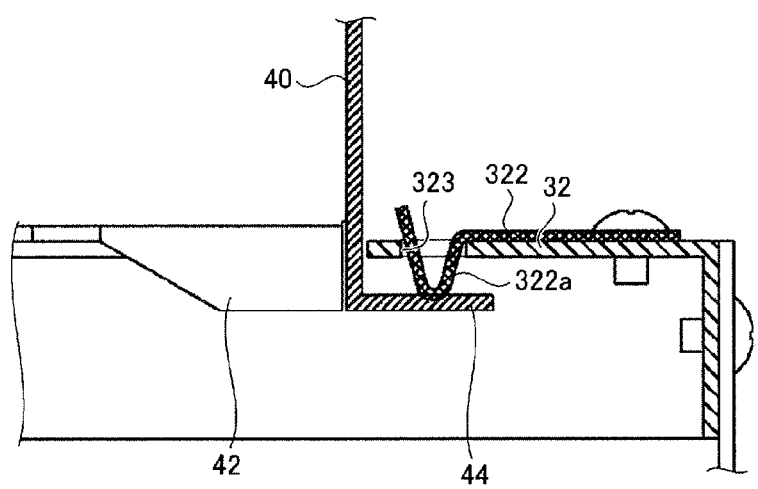
FIG. 16 is an enlarged sectional view for explaining a procedure of arrangement of the fan block in the inverter body and showing the state where the important part thereof is seen from a side.

The protrusive pieces 321 of the inverter body 30 are relatively inserted through the lock holes 43 of the fan block 40 as shown in FIG. 15 and the front end portion 322a of the leaf spring member 322 presses a rear extension portion 44 extending rearward from the lower end portion of the rear surface of the fan block 40, by its own elastically restoring force as shown in FIG. 16 to thereby engage the rear side of the fan block 40 with the inverter body 30.

Figure 17:
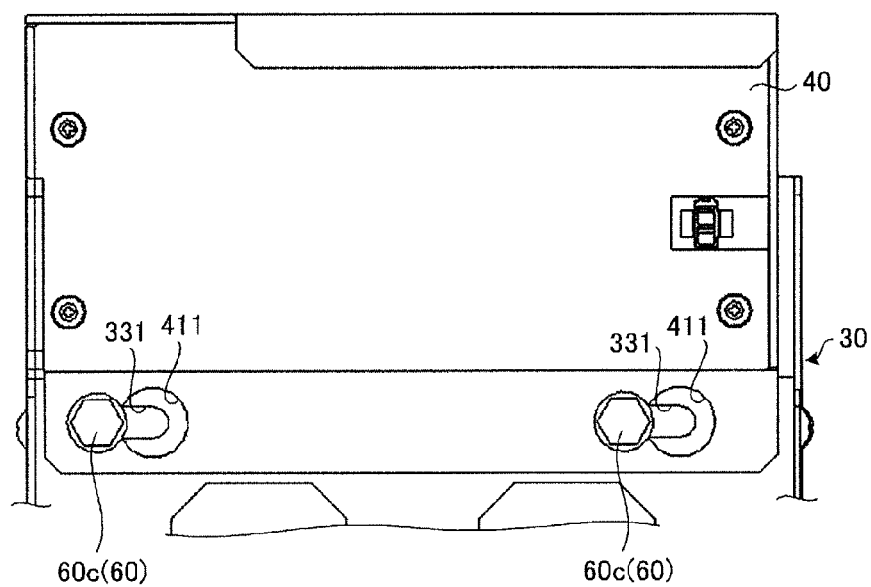
FIG. 17 is a front view of the fan block disposed in an upper portion of the inverter body.
Figure 18:
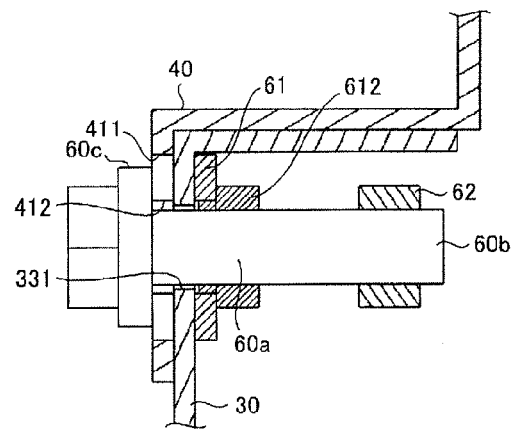
FIG. 18 is an enlarged sectional side view of an important part of the fan block disposed in the upper portion of the inverter body.
Figure 19:
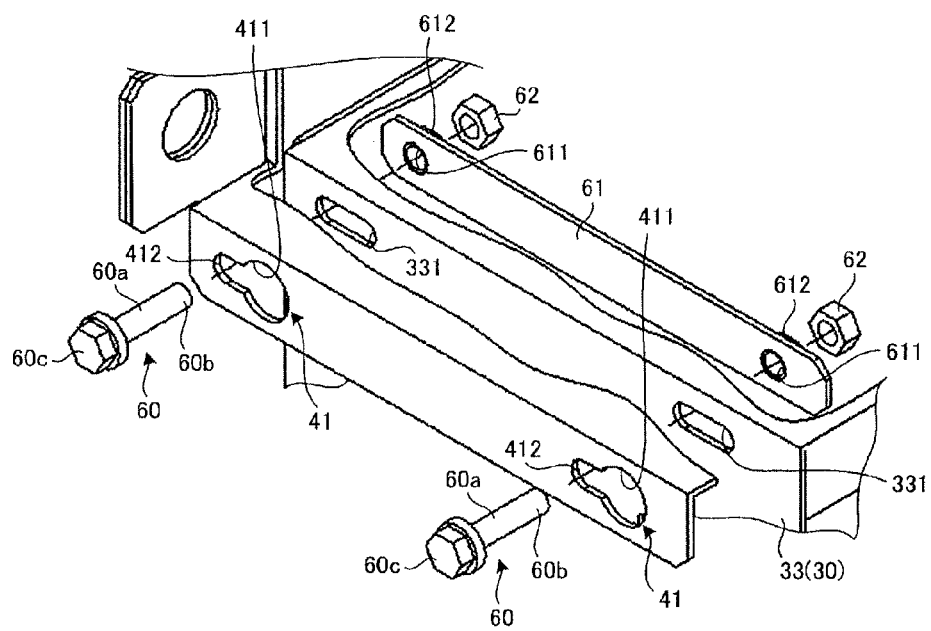
FIG. 19 is an exploded perspective view of the important part of the fan block disposed in the upper portion of the inverter body.

Then, the bolt members 60 are displaced along the horizontal direction so that the head portions 60c of the bolt members 60 move from the detachment hole portions 411 to the tightening hole portions 412, and the bolt members 60 are tightened to thereby engage the front side of the fan block 40 with the inverter body 30 as shown in FIGS. 17 to 19. Consequently, the fan block 40 can be disposed on the upper portion of the inverter body 30.

Figure 20:
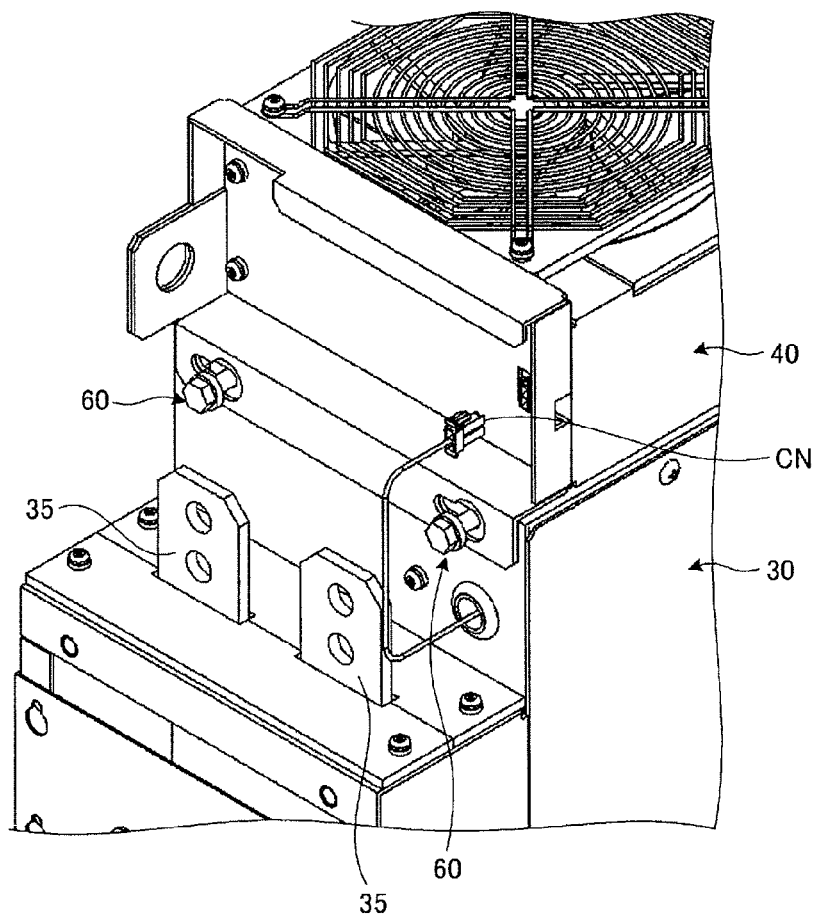
FIG. 20 is an explanatory view for explaining a procedure of detachment of the fan block from the inverter body.
Figure 21:
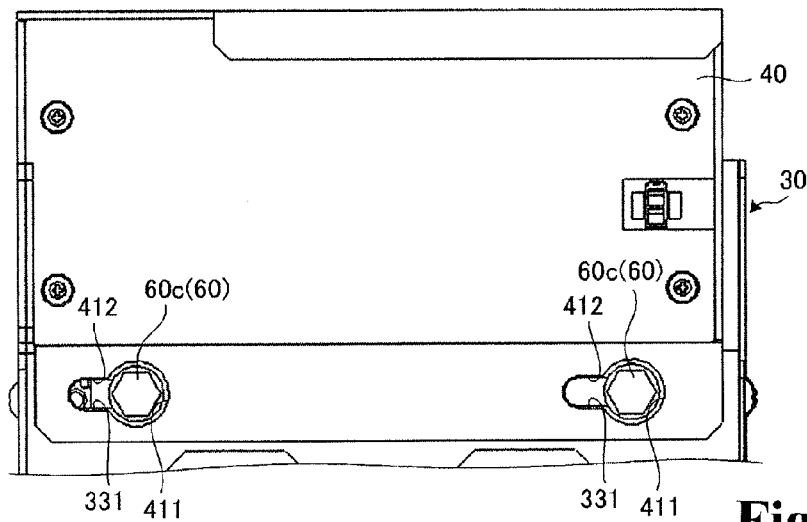
FIG. 21 is a front view for explaining the procedure of detachment of the fan block from the inverter body.
Figure 22:
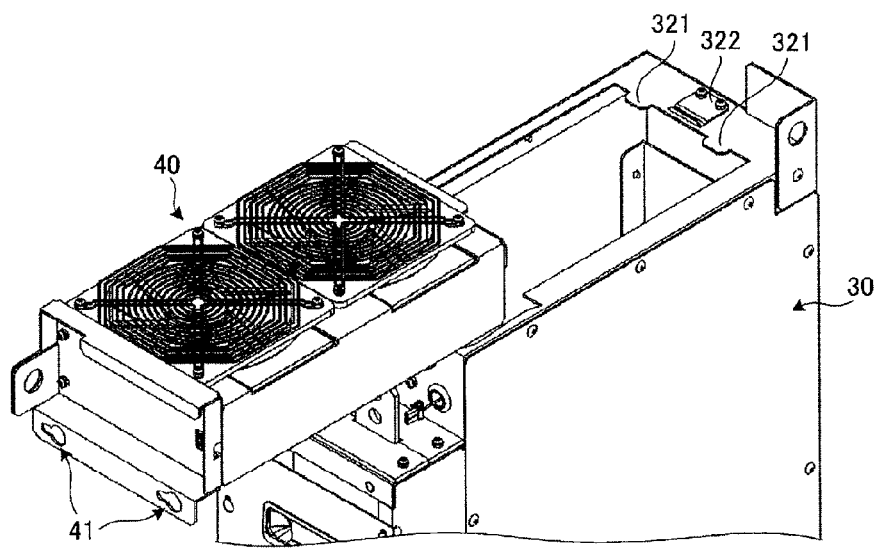
FIG. 22 is an explanatory view for explaining the procedure of detachment of the fan block from the inverter body.

On the other hand, such a fan block 40 can be detached from the inverter body 30 as follows. As shown in FIG. 20, a connector CN attached to the fan block 40 is detached to release the force of tightening the bolt members 60. Then, as shown in FIG. 21, the bolt members 60 are displaced along the horizontal direction so that the head portions 60c of the bolt members 60 move from the tightening hole portions 412 to the detachment hole portions 411 respectively. Then, as shown in FIG. 22, the fan block 40 is pulled frontward to thereby be detached from the inverter body 30.

That is, the bolt members 60, the engagement holes 41, the protrusive pieces 321, the lock holes 43 and the leaf spring member 322 located between the inverter body 30 and the fan block 40 form an engagement unit for engaging the fan block 40 with the inverter body 30. Particularly, the bolt members 60 and the engagement holes 41 engage the fan block 40 with the inverter body 30 when the bolt members 60 are tightened in the condition that the body portions 60a of the bolt members 60 pass through the tightening hole portions 412 of the engagement holes 41, but the fan block 40 is pulled frontward so as to be allowed to be detached from the inverter body 30 when the tightening force of the bolt members 60 is released and the bolt members 60 move to slide along the horizontal direction relative to the engagement holes 41 so that the body portions 60a pass through the detachment hole portions 411 of the engagement holes 41.

The inverter stack 10 having such a configuration is disposed while stored in the switchboard 50 as follows.

Figure 23:
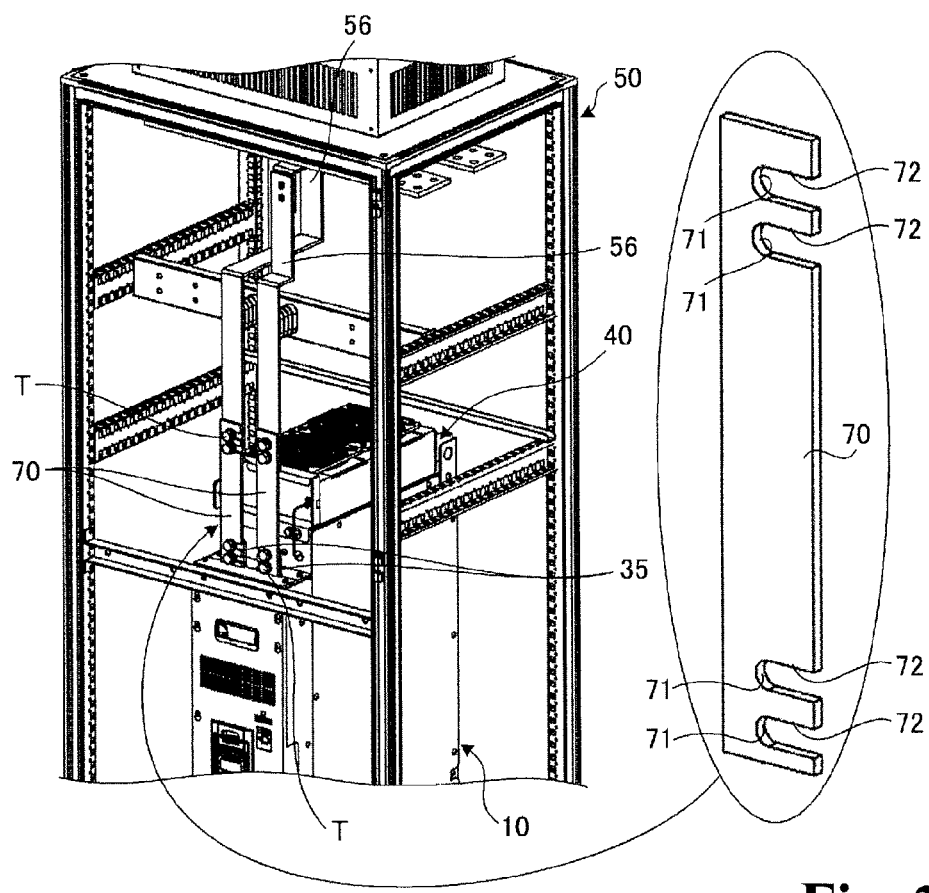
FIG. 23 is a perspective view showing a state of input side connection of the inverter stack to the switchboard.
Figure 24:
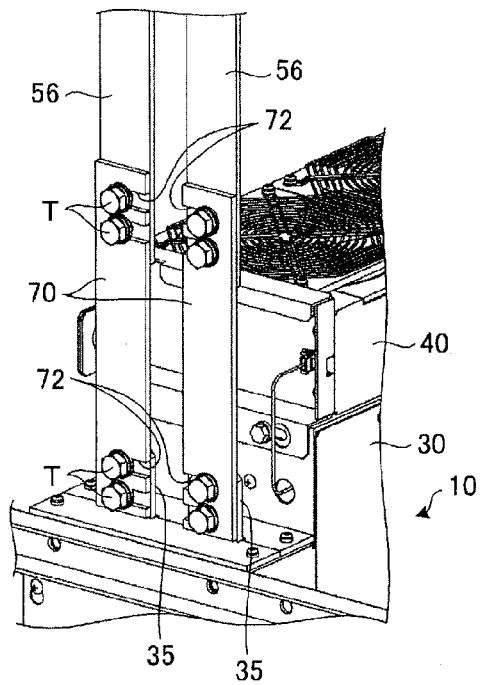
FIG. 24 is an enlarged perspective view showing the important part shown in FIG. 23.

FIG. 23 is a perspective view showing a state of input side connection of the inverter stack 10 to the switchboard 50. FIG. 24 is an enlarged perspective view showing the important part shown in FIG. 23. As shown in FIGS. 23 and 24, the inverter stack 10 is formed so that two input terminals 35 provided in the inverter body 30 are connected to input side terminals 56 of the switchboard 50 through input relay bars 70 respectively.

The input relay bars 70 are plate-like members. Each of the input relay bars 70 has an upper end portion fastened to corresponding one of the input side terminals 56 of the switchboard 50 through fastening members T, and a lower end portion fastened to corresponding one of the input terminals 35 of the inverter stack 10 through fastening members T. In this manner, the input terminals 35 are fastened to the input side terminals 56 respectively as described above.

In each input relay bar 70, notches 72 which communicate with a common side portion (right side or left side) are formed in hole portions 71 through which bolts as the fastening members T pass.

Figure 25:
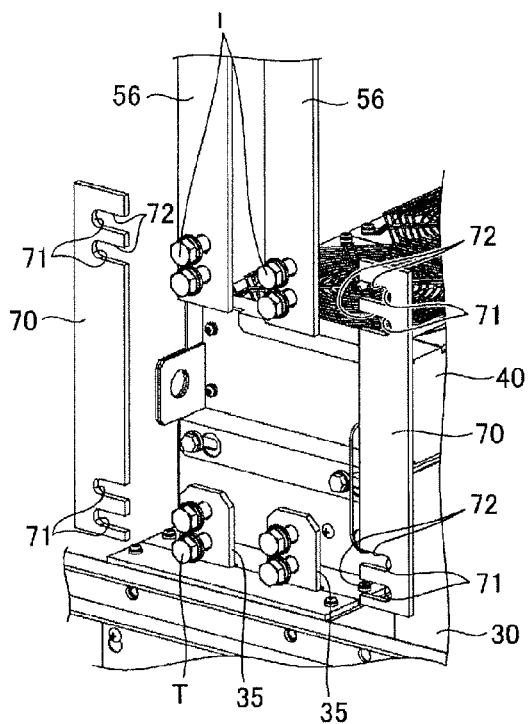
FIG. 25 is a perspective view showing a state of input side disconnection of the inverter stack from the switchboard.

Because the notches 72 are formed in the hole portions 71 of each input relay bar 70 in this manner, the input relay bar 70 can be removed without detachment of the fastening members T when the tightening force of the fastening members T is released as shown in FIG. 25.

Figure 26:
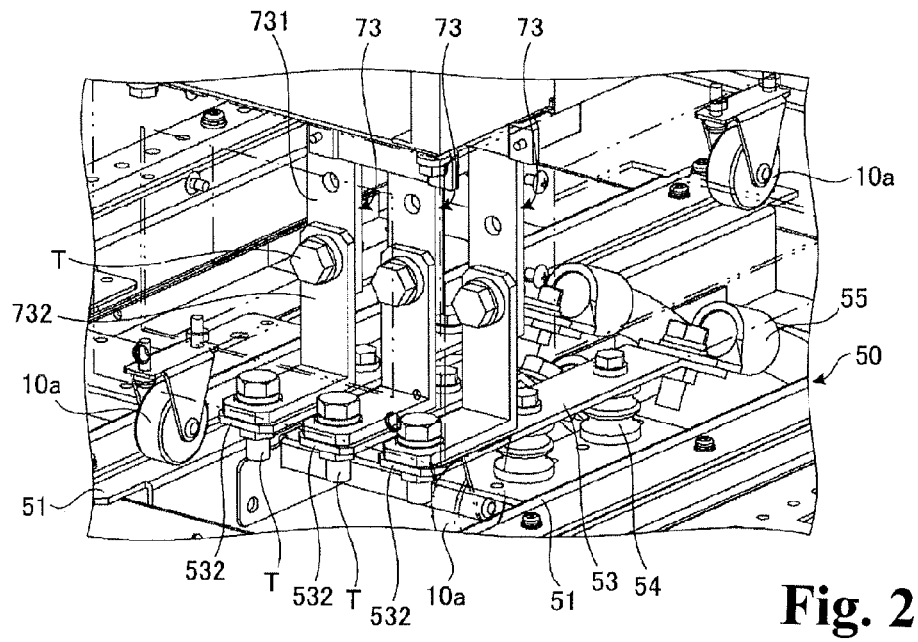
FIG. 26 is a perspective view showing a state of output side connection of the inverter stack to the switchboard.

FIG. 26 is a perspective view showing a state of output side connection of the inverter stack 10 to the switchboard 50. As shown in FIG. 26 and the aforementioned FIG. 8, three not-shown output terminals provided in the inverter body 30 are connected to the front end portions 532 of the output relay terminals 53 of the switchboard 50 through output relay bars 73 respectively. Here, the number of the output relay bars 73 is three, that is, an output relay bar 73 connecting a U-phase output terminal to a U-phase output relay terminal 53, an output relay bar 73 connecting a V-phase output terminal to a V-phase output relay terminal 53, and an output relay bar 73 connecting a W-phase output terminal to a W-phase output relay terminal 53.

Such output relay bars 73 have the same configuration. Each output relay bar 73 has a first output relay bar 731 and a second output relay bar 732. The first output relay bar 731 extends in the vertical direction and has an upper end portion connected to corresponding one of the output terminals.

Figure 27:
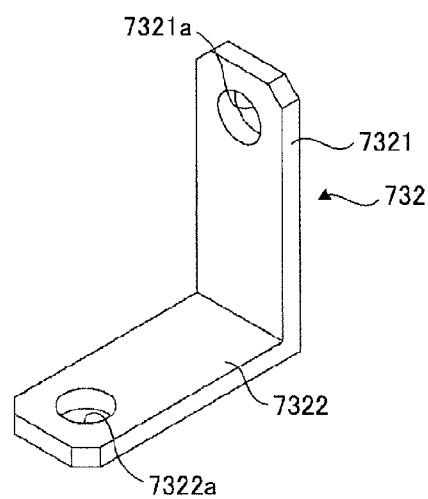
FIG. 27 is a perspective view showing a second output relay bar as a constituent of the output relay bar shown in FIG. 26.

As shown in FIG. 27, the second output relay bar 732 is shaped like an L figure in vertical section. More particularly, the second output relay bar 732 has a base part 7321 and a front end part 7322. The base part 7321 is a portion which extends in the vertical direction and which protrudes downward from the bottom of the inverter stack 10. The base part 7321 has an upper end portion fastened to a lower end portion of the first output relay bar 731 through a fastening member T. The front end part 7322 is a portion which extends frontward from a lower end portion of the base part 7321. The front end part 7322 is fastened to the front end portion 532 of corresponding one of the output relay terminals 53 through a fastening member T. That is, the output relay terminals 53 provided in the switchboard 50 have rear end portions 531 to which the output electric wires 55 connected to a load such as a motor are attached, and front end portions 532 which are connected to the output terminals of the inverter stack 10 and which are fastened to the output relay bars 73 protruding downward from the bottom of the inverter stack 10, through fastening members T.

In each of such second output relay bars 732, a through-hole 7321a through which the fastening member T at the base part 7321 passes, and a through-hole 7322a through which the fastening member T at the front end part 7322 passes, are formed so that the diameter of each of the through-holes 7321a and 7322a is larger than the outer diameter of corresponding one of the fastening members T.

Thus, the through-hole 7321a of the base part 7321 can absorb horizontal direction and vertical direction dimensional tolerances while the through-hole 7322a of the front end part 7322 can absorb horizontal direction and front/rear direction dimensional tolerances.

Figure 28:
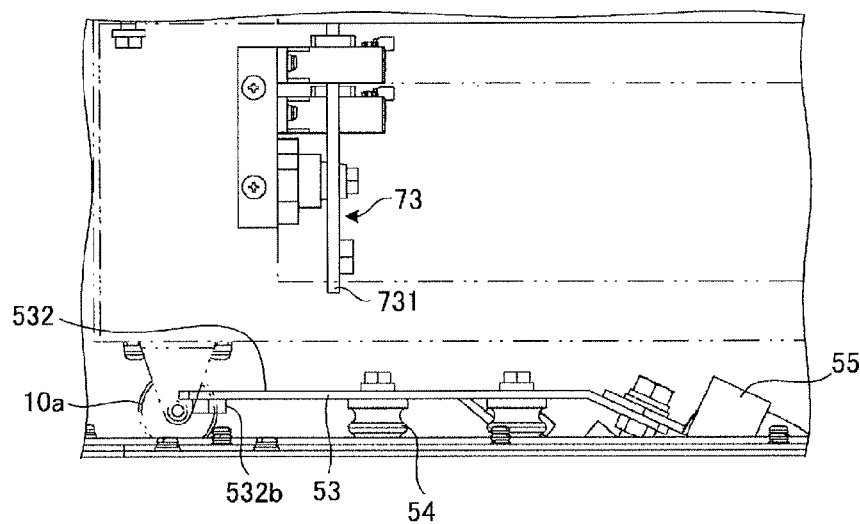
FIG. 28 is a side view showing a state where the second output relay bar as a constituent of the output relay bar shown in FIG. 26 is removed.

As shown in FIG. 28, in each of the output relay bars 73, when the second output relay bar 732 is detached both from the first output relay bar 731 and from corresponding one of the output relay terminals 53, inverter unit start-up for inspecting drive of the inverter stack 10 can be executed.

Figure 29:
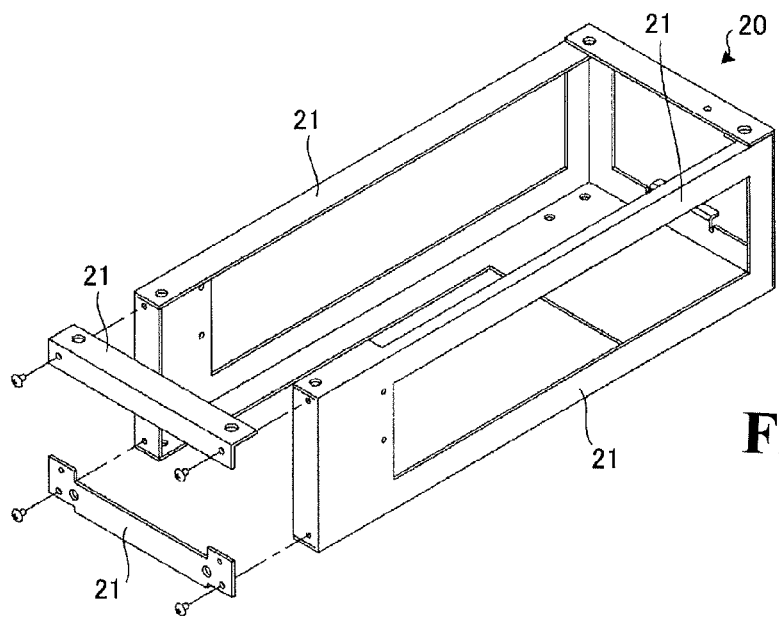
FIG. 29 is an explanatory view showing the configuration of a lower frame.

Because the output relay bars 73 are provided so as to pass through the lower frame 20 of the inverter stack 10, the lower frame 20 is formed so that frame members 21 forming sides of a quadrilateral frame through which the output relay bars 73 pass, that is, a frame member 21 forming a front upper side and a frame member 21 forming a front lower side are made of a nonmagnetic substance such as stainless steel while the other frame members 21 are made of a metal plate or the like, as shown in FIG. 29.

Because the frame members 21 forming the sides of the quadrilateral frame through which the output relay bars 73 pass are made of a nonmagnetic substance in this manner, generation of an eddy current can be limited.

Figure 30:
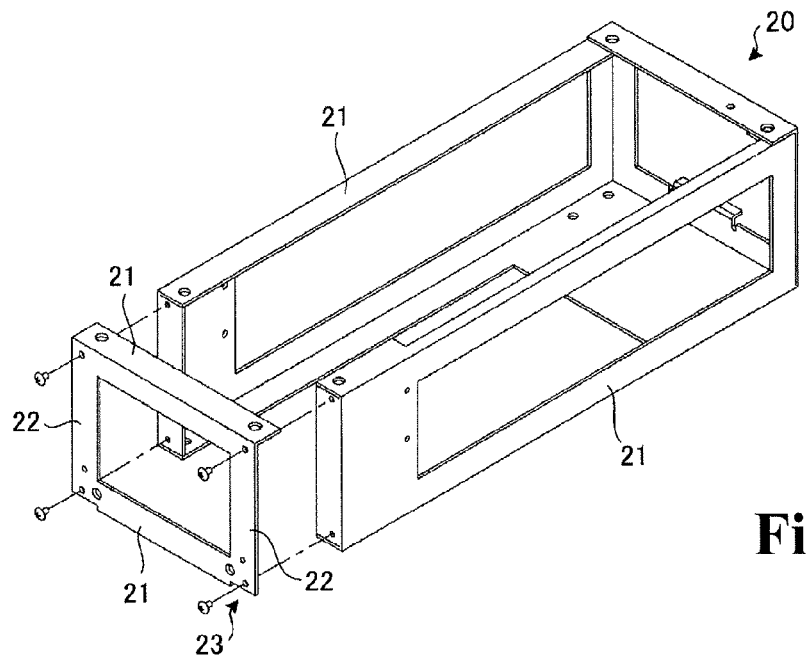
FIG. 30 is an explanatory view showing the configuration of a modification of the lower frame.

Although FIG. 29 shows the state where the frame member 21 forming the front upper side and the frame member 21 forming the front lower side as sides of the quadrilateral frame through which the output relay bars 73 pass are made of a nonmagnetic substance, a front portion 23 of the lower frame 20 composed of a frame member 21 forming a front upper side, a frame member 21 forming a front lower side and vertical frame members 22 forming a pair of left and right front vertical sides for connecting the two frame members 21 to each other in the lower frame 20 according to the embodiment may be made of a nonmagnetic substance such as stainless steel as shown in FIG. 30.

Also in such a configuration, the frame members 21 forming the sides of the quadrilateral frame through which the output relay bars 73 pass are made of a nonmagnetic substance so that generation of an eddy current can be limited.

Although there has been shown the state where the output relay bars 73 are used as output relay portions, that is, an output relay portion for connecting the U-phase output terminal to the U-phase output relay terminal 53, an output relay portion for connecting the V-phase output terminal to the V-phase output relay terminal 53, and an output relay portion for connecting the W-phase output terminal to the W-phase output relay terminal 53 in the inverter apparatus, a unit alternatively selected from a first output relay unit 80 and a second output relay unit 90 may be used as an output relay portion in place of the output relay bars 73 in this embodiment.

Figure 31:
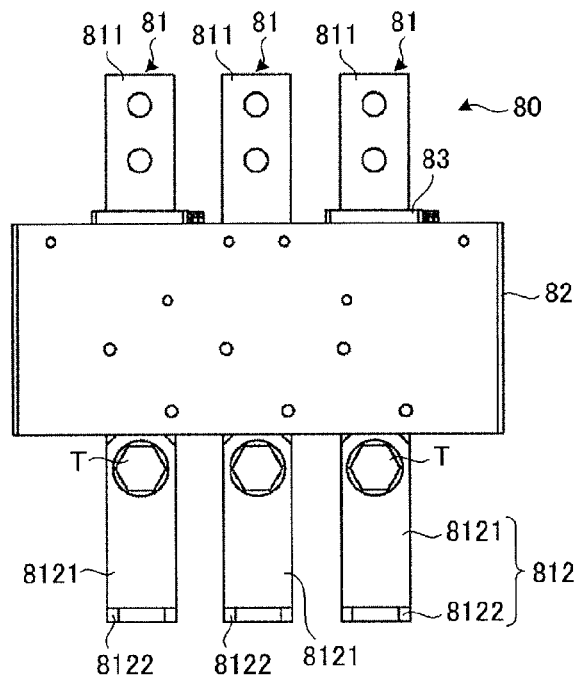
FIG. 31 is a front view showing a first output relay unit.
Figure 32:
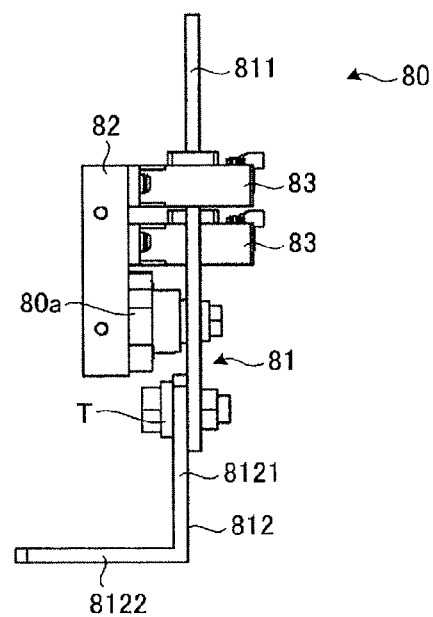
FIG. 32 is a side view showing the first output relay unit.
Figure 33:
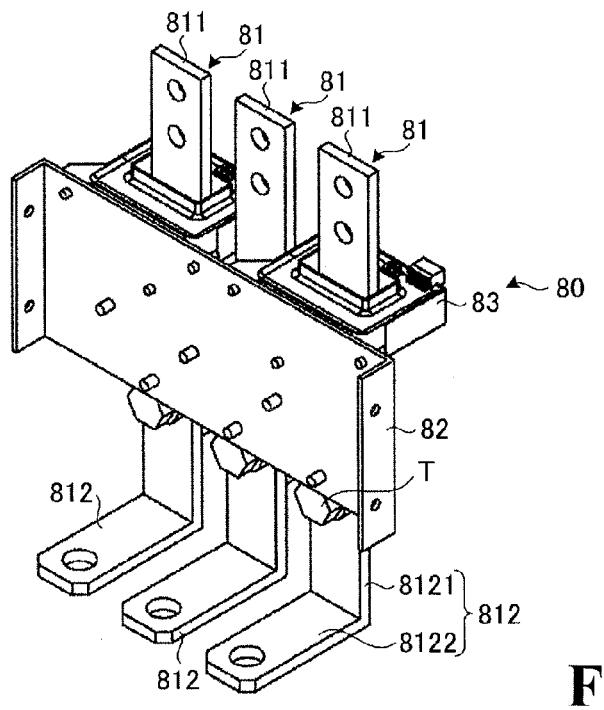
FIG. 33 is a perspective view of the first output relay unit viewed from the front side.
Figure 34:
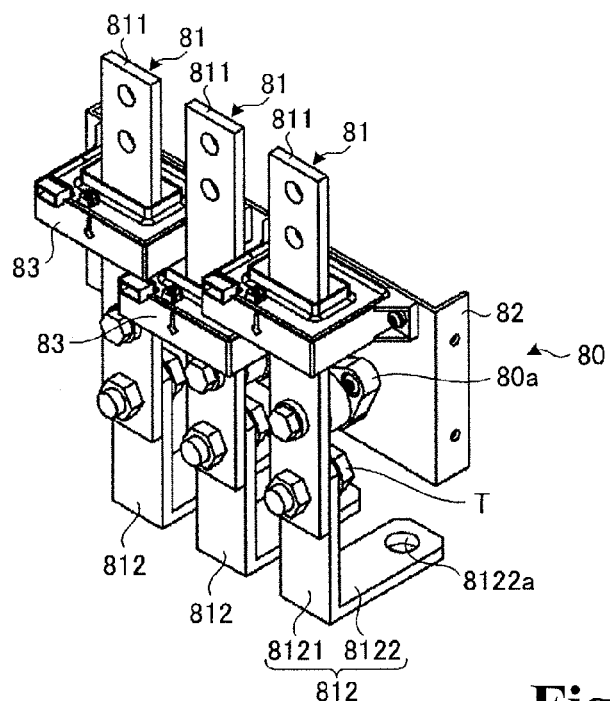
FIG. 34 is a perspective view of the first output relay unit viewed from the rear side.

FIGS. 31 to 34 show the first output relay unit 80. FIG. 31 is a front view. FIG. 32 is a side view. FIG. 33 is a perspective view seen from the front side. FIG. 34 is a perspective view seen from the rear side.

The first output relay unit 80 illustrated here has three output relay bars 81, and a fixing bracket 82. The three output relay bars 81 are an output relay bar for connecting the U-phase output terminal to the U-phase output relay terminal 53, an output relay bar for connecting the V-phase output terminal to the V-phase output relay terminal 53, and an output relay bar for connecting the W-phase output terminal to the W-phase output relay terminal 53.

Each of these three output relay bars 81 has a first output relay bar 811, and a second output relay bar 812. The first output relay bar 811 extends in the vertical direction and has an upper end portion which can be connected to corresponding one of the output terminals. The second output relay bar 812 is shaped like an L figure in vertical section. More particularly, the second output relay bar 812 has a base part 8121, and a front end part 8122. The base part 8121 extends in the vertical direction and has an upper end portion fastened to a lower end portion of the first output relay bar 811 through a fastening member T. The front end part 8122 is a portion which extends frontward from a lower end portion of the base part 8121 and which can be fastened to the front end portion 532 of corresponding one of the output relay terminals 53 through a fastening member T. In each second output relay bar 812, a through-hole (not shown) through which the fastening member T at the base part 8121 passes and a through-hole 8122a through which the fastening member T at the front end part 8122 passes are formed so that the diameter of each of the not-shown through-hole and the through-hole 8122a is larger than the outer diameter of corresponding one of the fastening members T.

The fixing bracket 82 is made of a metal plate bent suitably. The fixing bracket 82 is integrated with the three output relay bars 81 through a resin 80a as an insulating member so as to be provided as a unit. Such a fixing bracket 82 is provided for fixation to the inverter stack 10. Incidentally, the reference sign 83 in FIGS. 31 to 34 designates a Hall CT for detecting a current.

Because such a first output relay unit 80 has three output relay bars 81, three-phase outputs can be outputted from the output terminals to the output relay terminals 53 directly.

Figure 35:
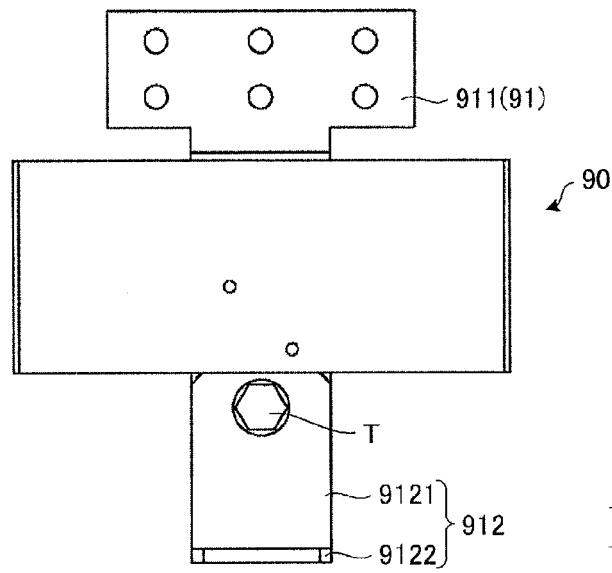
FIG. 35 is a front view showing a second output relay unit.
Figure 36:
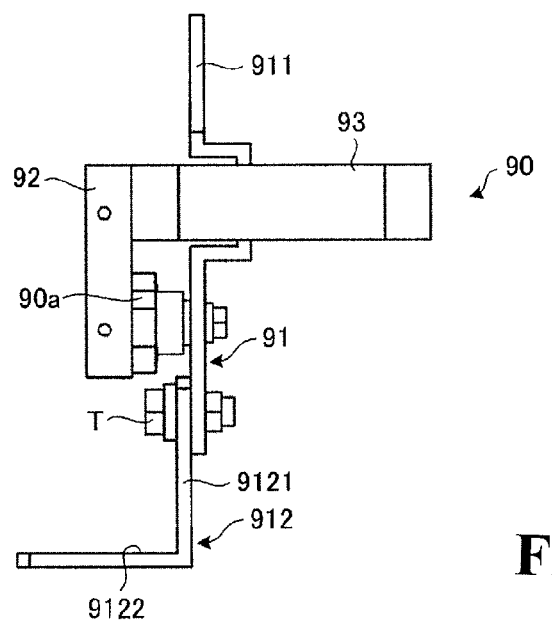
FIG. 36 is a side view showing the second output relay unit.
Figure 37:
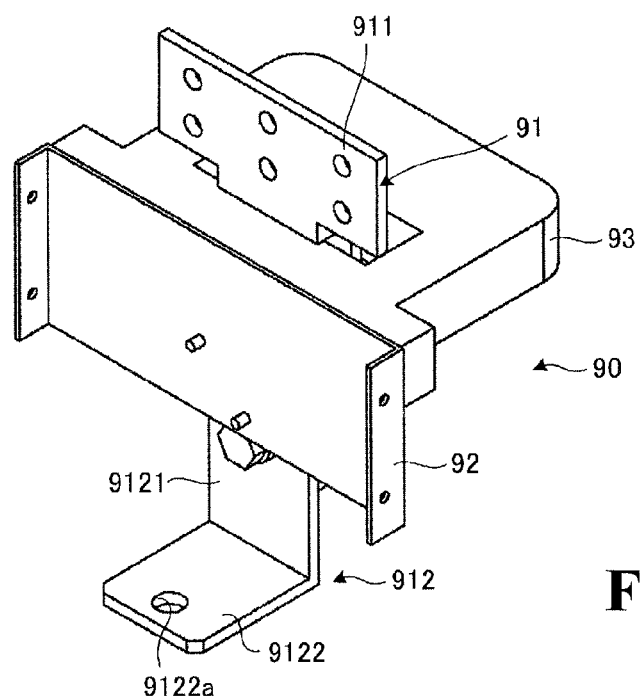
FIG. 37 is a perspective view of the second output relay unit viewed from the front side.
Figure 38:
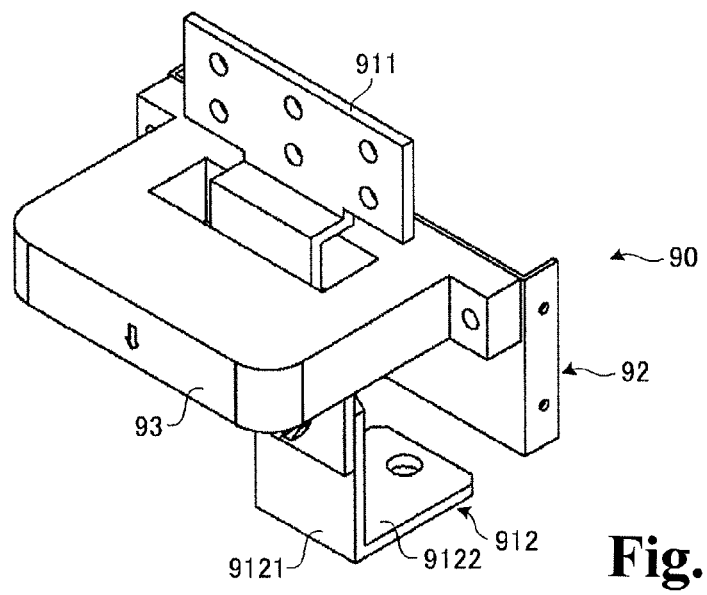
FIG. 38 is a perspective view of the second output relay unit viewed from the rear side.

FIGS. 35 to 38 show the second output relay unit 90. FIG. 35 is a front view. FIG. 36 is a side view. FIG. 37 is a perspective view seen from the front side. FIG. 38 is a perspective view seen from the rear side.

The second output relay unit 90 illustrated here has an output relay bar 91, and a fixing bracket 92. The output relay bar 91 has a first output relay bar 911, and a second output relay bar 912. The first output relay bar 911 extends in the vertical direction and has an upper end portion which can be connected to three output terminals.

The second output relay bar 912 is shaped like an L figure in vertical section. More particularly, the second output relay bar 912 has a base part 9121, and a front end part 9122. The base part 9121 extends in the vertical direction and has an upper end portion fastened to a lower end portion of the first output relay bar 911 through a fastening member T. The front end part 9122 is a portion which extends frontward from a lower end portion of the base part 9121 and which can be fastened to the front end portion 532 of any output relay terminal 53 through a fastening member T. In the second output relay bar 912, a through-hole (not shown) through which the fastening member T at the base part 9121 passes, and a through-hole 9122a through which the fastening member T at the front end part 9122 passes, are formed so that the diameter of each of the not-shown through-hole and the through-hole 9122a is larger than the outer diameter of corresponding one of the fastening members T.

The fixing bracket 92 is made of a metal plate bent suitably. The fixing bracket 92 is integrated with the output relay bar 91 through a resin 90a as an insulating member so as to be provided as a unit. Such a fixing bracket 92 is provided for fixation to the inverter stack 10. Incidentally, the reference sign 93 in FIGS. 35 to 38 designates a Hall CT for detecting a current.

Because such a second output relay unit 90 has one output relay bar 91, the three-phase outputs from the output terminals can be outputted as any single phase of U, V and W phases to the output relay terminals 53.

Figure 39:
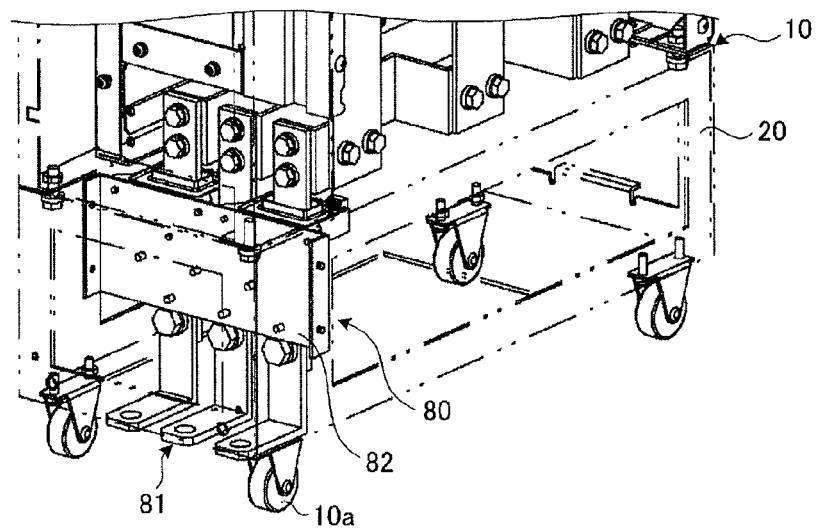
FIG. 39 is an explanatory view showing a state where the first output relay unit shown in FIGS. 31 to 34 is attached.
Figure 40:
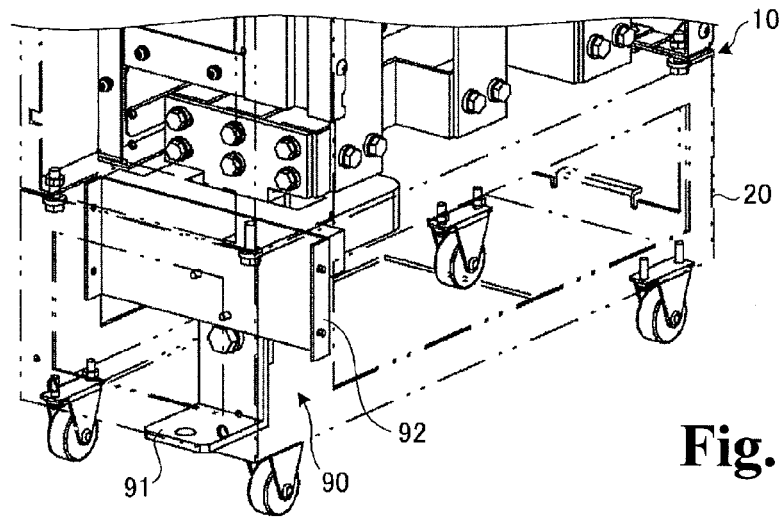
FIG. 40 is an explanatory view showing a state where the second output relay unit shown in FIGS. 35 to 38 is attached.

As shown in FIG. 39, the first output relay unit 80 may be used as an output relay portion in such a manner that the first output relay unit 80 is fixed to the lower frame 20 of the inverter stack 10 through the fixing bracket 82, and the respective output relay bars 81 are fastened to the output terminals and the output relay terminals 53. As shown in FIG. 40, the second output relay unit 90 may be used as an output relay portion in such a manner that the second output relay unit 90 is fixed to the lower frame 20 of the inverter stack 10 through the fixing bracket 92, and the output relay bar 91 is fastened to the respective output terminals and any output relay terminal 53.

As described above, in the transportation cart 1, the support surface 3 which supports the inverter stack 10 placed on the support surface 3 has the same height level as the placement surfaces 51 of the switchboard 50 as a target of installation where the inverter stack 10 is placed. Because the protrusion portion 3a provided so as to protrude outward from the support surface 3 enters the entrance portion 52 formed between the placement surfaces 51 in the switchboard 50 to thereby perform horizontal alignment, high alignment accuracy as in a lifter heretofore used is not required. In addition, a mechanism for moving a support along the vertical direction as in the lifter is not required. Hence, according to the transportation cart 1, the inverter stack 10 can be installed in the switchboard 50 more easily while reduction in cost is attained.

According to the transportation cart 1, the rail guides 4 disposed along the movable direction of the inverter stack 10 on the support surface 3 restrict the inverter stack 10 from shifting in the horizontal direction with respect to the direction of movement when the inverter stack 10 is moved. Accordingly, the work of installation of the inverter stack 10 can be performed well.

Further, according to the transportation cart 1, the fixing metal plate 5 erected on the support surface 3 is fastened to the inverter stack 10 supported by the support surface 3, through fastening members such as screws N1 to thereby fix and support the inverter stack 10. Accordingly, the inverter stack 10 can be prevented from falling down while the inverter stack 10 is being transported.

Further, according to the transportation cart 1, the grippers 6 are provided as a pair of left and right grippers in the base 2 including the support surface 3. Accordingly, the inverter stack 10 can be transported well even in a narrow passage or the like.

In the inverter stack 10, the fan block 40 is engaged with the inverter body 30 when the bolt members 60 are tightened in the condition that the body portions 60a of the bolt members 60 pass through the tightening hole portions 412 of the engagement holes 41 and, on the other hand, the fan block 40 is pulled out toward the front side so as to be allowed to be removed from the inverter body 30 when the tightening force of the bolt members 60 is released to move and slide the bolt members 60 in the horizontal direction relative to the engagement holes 41 so that the body portions 60a pass through the detachment hole portions 411 of the engagement holes 41. Accordingly, the fan block 40 can be detached from the inverter body 30 even in the state where the width of a storage region where the inverter stack 10 is installed is narrow. Thus, the work of taking the fan block 40 out can be performed easily. Particularly, according to the inverter stack 10, because the dropping-off prevention nuts 62 are fixed to the front end portions 60b of the bolt members 60, the bolt members 60 can be prevented from dropping off when the tightening force of the bolt members 60 is released. Accordingly, the bolt members 60 can be prevented from dropping off when the fan block 40 is detached from the inverter body 30.

Moreover, according to the inverter stack 10, the fan block 40 can be disposed on the upper portion of the inverter body 30 by a simple operation of pressing the fan block 40 rearward because the protrusive pieces 321 of the inverter body 30 pass through the lock holes 43 of the fan block 40 and the leaf spring member 322 attached to the inverter body 30 presses the rear extension portion 44 of the fan block 40. Accordingly, the work of installation of the fan block 40 can be performed well.

In the inverter apparatus, the output relay terminals 53 are provided in the storage bottom portion for storing the inverter stack 10 so as to extend along the direction of entrance of the inverter stack 10. The output electric wires 55 connected to a load such as a motor are attached to the rear end portions 531 of the output relay terminals 53. The front end portions 532 of the output relay terminals 53 are connected to the output terminals of the inverter stack 10 and fastened to the output relay bars 73 protruding downward from the bottom of the inverter stack 10, through fastening members T. Accordingly, the state of output-side connection of the inverter stack 10 to the switchboard 50 can be released by a simple operation of unfastening the output relay terminals 53 from the output relay bars 73. Hence, according to the inverter apparatus, the inverter stack 10 can be detached from the switchboard 50 easily.

According to the inverter apparatus, each input relay bar 70 is formed in such a manner that fastening members T such as bolts are inserted in the hole portions 71 formed with the notches 72 communicating with a common side portion. Accordingly, when the tightening force of the fastening members T is released, the input relay bar 70 can be removed without removal of the fastening members T so that the state of input-side connection of the inverter stack 10 to the switchboard 50 can be released. Accordingly, the inverter stack 10 can be detached from the switchboard 50 easily in this manner.

Further, according to the inverter apparatus, the lower frame 20 as a constituent of the inverter stack 10 is configured so that frame members 21 forming sides of a quadrilateral frame through which the output relay bars 73 pass are made of a nonmagnetic substance. Accordingly, generation of an eddy current can be limited so that heating and vibration can be prevented from being caused by generation of an eddy current or the like. In addition, because the other frame members 21 of the lower frame 20 are made of a metal plate or the like, the manufacturing cost can be reduced compared with the state where all the frame members are made of a nonmagnetic substance such as stainless steel. Accordingly, reduction in manufacturing cost can be attained while heating and vibration are prevented from being caused by generation of an eddy current or the like. Incidentally, if it is obvious from the amount of the current transferred in the output relay bars 73 that there is no eddy current generated in the lower frame 20, the frame members 21 of the nonmagnetic substance may be replaced by frame members made of a magnetic substance such as a metal plate. Thus, when it is obvious that there is no eddy current generated, all the frame members 21 forming the lower frame 20 may be made of a magnetic substance so that reduction in operating cost can be attained.

Further, according to the inverter apparatus, a unit alternatively selected from the first output relay unit 80 and the second output relay unit 90 can be used as an output relay portion in place of the output relay bars 73. Accordingly, the configuration of output terminals for connecting the inverter stack 10 and the switchboard 50 to each other can be changed easily.

Although preferred embodiments of the invention have been described above, the invention is not limited thereto and various changes may be made.

Although the aforementioned embodiment is designed to use a unit alternatively selected from the first output relay unit 80 and the second output relay unit 90 as an output relay portion, the following unit having an attachment member 84 may be used as a modification of the first output relay unit 80 in the invention.

Figure 41:
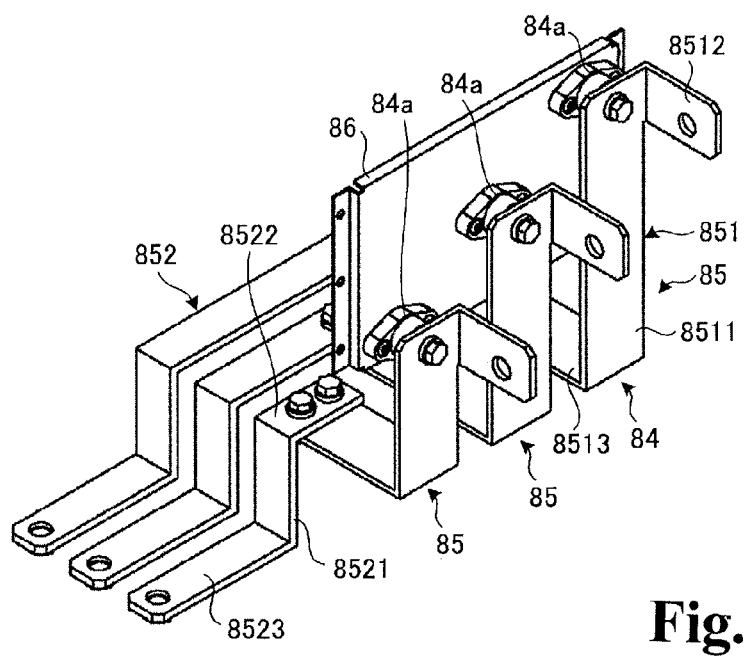
FIG. 41 is a perspective view of an attachment member which can be applied to the first output relay unit shown in FIGS. 31 to 34, viewed from the front side.
Figure 42:
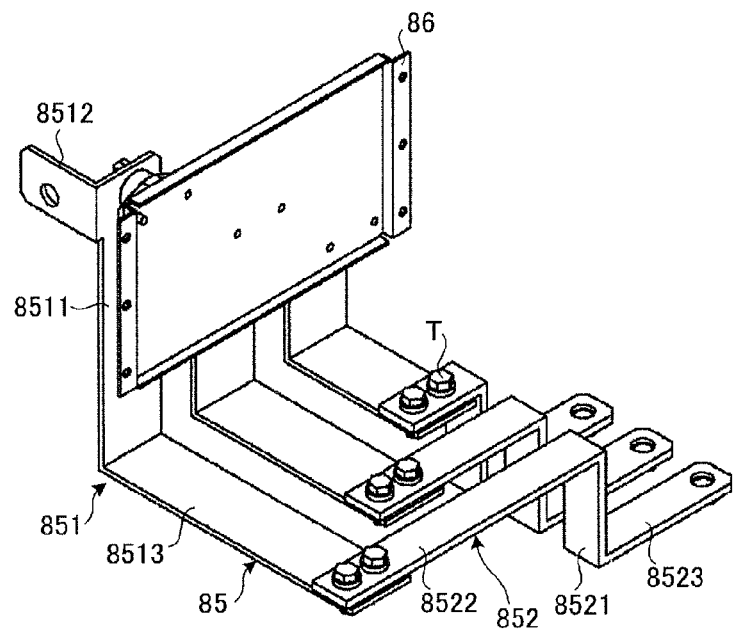
FIG. 42 is a perspective view of the attachment member which can be applied to the first output relay unit shown in FIGS. 31 to 34, viewed from the rear side.

FIGS. 41 and 42 show the attachment member 84 which can be applied to the first output relay unit 80 shown in FIGS. 31 to 34. FIG. 41 is a perspective view seen from the front side. FIG. 42 is a perspective view seen from the rear side. The attachment member 84 illustrated here has three output relay attachment bars 85.

Each of these three output relay attachment bars 85 has a first output relay attachment bar 851, and a second output relay attachment bar 852. The first output relay attachment bar 851 has a first base part 8511 extending in the vertical direction, a right extension part 8512 extending rightward from an upper end portion of the first base part 8511, and a left extension part 8513 extending leftward from a lower end portion of the first base part 8511. The first base part 8511 is connected to an attachment fixing bracket 86 through a resin 84a as an insulating member.

The second output relay attachment bar 852 has a second base part 8521 extending in the vertical direction, a rear extension part 8522 extending rearward from an upper end portion of the second base part 8521, and a front extension part 8523 extending frontward from a lower end portion of the second base part 8521. The rear extension part 8522 is fastened to the left extension part 8513 of the first output relay attachment bar 851 through fastening members T.

Figure 43:
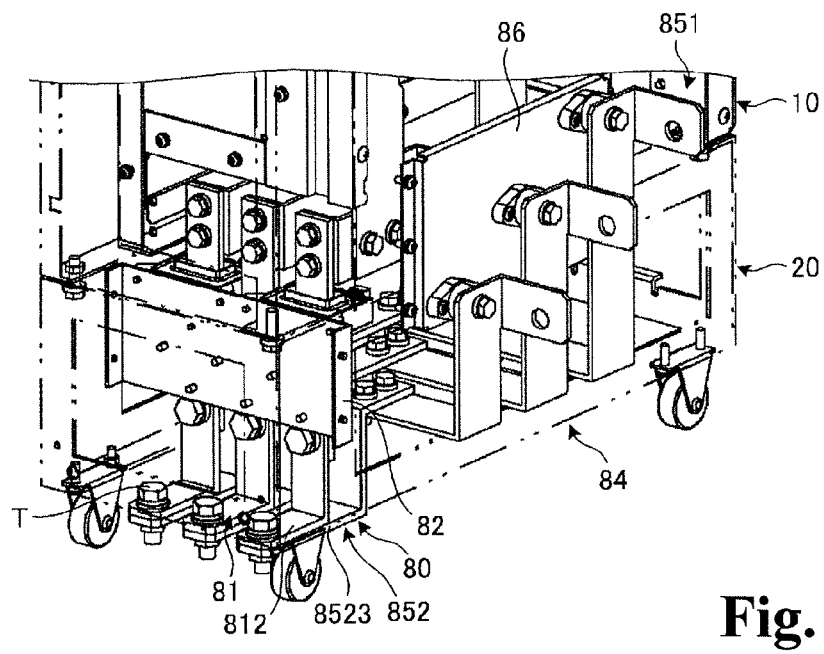
FIG. 43 is an explanatory view showing a state where the attachment member shown in FIGS. 41 and 42 is applied.

Such an attachment member 84 is used in the condition that the attachment fixing bracket 86 is fixed to the lower frame 20 of the inverter stack 10 and the front extension parts 8523 of the respective second output relay attachment bars 852 are fastened to the front end parts 8122 of the corresponding second output relay bars 812 through fastening members T as shown in FIG. 43.

When the first output relay unit 80 having such an attachment member 84 is used as an output relay portion, customer requests and specification changes can be coped with flexibly.

REFERENCE SIGNS LIST 1 transportation cart
1a cart caster
2 base
3 support surface
3a protrusion portion
4 rail guide (guide member)
5 fixing metal plate (fixing support member)
5a threaded hole
6 gripper
10 inverter stack
10a caster
20 lower frame
21 frame member
30 inverter body
31 opening
32 rear edge portion
321 protrusive piece
322 leaf spring member
322a front end portion
323 through-hole
33 upper front surface
331 long hole
34 upper edge portion
35 input terminal
40 fan block
40a lower opening
41 engagement hole
411 detachment hole portion
412 tightening hole portion
42 flange
43 lock hole
44 rear extension portion
50 switchboard
51 placement surface
52 entrance portion
53 output relay terminal
531 rear end portion
532 front end portion
532a through-hole
532b nut
54 insulator
55 output electric wire
56 input-side terminal
60 bolt member
60a body portion
60b front end portion
60c head portion
61 metal plate member
611 through-hole
612 nut
62 dropping-off prevention nut
70 input relay bar
71 hole portion
72 notch
73 output relay bar
731 first output relay bar
732 second output relay bar
7321 base part
7322 front end part
7321a through-hole
7322a through-hole
80 first output relay unit
81 output relay bar
80a resin
811 first output relay bar
812 second output relay bar
8121 base part
8122 front end part
8122a through-hole
82 fixing bracket
84 attachment member
84a resin
85 output relay attachment bar
851 first output relay attachment bar
8511 first base part
8512 right extension part
8513 left extension part
852 second output relay attachment bar
8521 second base part
8522 rear extension part
8523 front extension part
86 attachment fixing bracket
90 second output relay unit
90a resin
91 output relay bar
911 first output relay bar
912 second output relay bar
9121 base part
9122 front end part
9122a through-hole
92 fixing bracket
F fan
T fastening member

What is claimed is:

1. An inverter apparatus comprising:
an inverter stack having casters at a bottom; and
a switchboard for entering the inverter stack from a front side to store,
wherein the switchboard has an output relay terminal, at a storage bottom portion to store the inverter stack, extending along an entering direction of the inverter stack, and the output relay terminal is attached with an output electric wire connected to a load at a rear end portion, is connected to an output terminal of the inverter stack at a front end portion, and is fastened to an output relay bar protruding downward from the bottom of the inverter stack through a fastening member.

2. An inverter apparatus according to claim 1, further comprising an input relay bar having one end portion fastened to an input-side terminal of the switchboard through a fastening member, and another end portion fastened to an input terminal of the inverter stack through a fastening member, to thereby connect the input-side terminal and the input terminal to each other, wherein the input relay bar is arranged so that the fastening members are inserted in hole portions formed with notches communicating with a common side portion.

3. An inverter apparatus according to claim 1, wherein the output relay bar includes:

a first output relay bar extending in a vertical direction and having an upper end portion connected to the output terminal;

a second output relay bar having a base part extending in the vertical direction, and a front end part extending along the entering direction of the inverter stack from a lower end of the base part so that the base part is fastened to a lower end portion of the first output relay bar through a fastening member, and the front end part is fastened to the output relay terminal through a fastening member; and the second output relay bar is formed such that a through-hole to insert a fastening member has a diameter larger than an outer diameter of the fastening member.

\* \* \* \* \*

UNITED STATES PATENT AND TRADEMARK OFFICE
CERTIFICATE OF CORRECTION

| | |
|---|---|
| PATENT NO. | : 9,203,217 B2 |
| APPLICATION NO. | : 14/123803 |
| DATED | : December 1, 2015 |
| INVENTOR(S) | : Makoto Takano |

Page 1 of 1

It is certified that error appears in the above-identified patent and that said Letters Patent is hereby corrected as shown below:

IN THE SPECIFICATION

Please change column 4, line 62, from "... rail guides 9 guide ..." to --... rail guides 4 guide ...--.

Please change column 6, line 20, from "... a frond end ..." to --... a front end ...--.

Signed and Sealed this
Ninth Day of February, 2016

Michelle K. Lee
*Director of the United States Patent and Trademark Office*